(12) United States Patent
Nakajima et al.

(10) Patent No.: US 9,570,436 B2
(45) Date of Patent: Feb. 14, 2017

(54) SEMICONDUCTOR DEVICE

(71) Applicant: NATIONAL INSTITUTE OF ADVANCED INDUSTRIAL SCIENCE AND TECHNOLOGY, Tokyo (JP)

(72) Inventors: Akira Nakajima, Ibaraki (JP); Shinichi Nishizawa, Ibaraki (JP); Hiromichi Ohashi, Ibaraki (JP)

(73) Assignee: NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 0 days.

(21) Appl. No.: 14/407,922

(22) PCT Filed: Jun. 5, 2013

(86) PCT No.: PCT/JP2013/065552
§ 371 (c)(1),
(2) Date: Dec. 12, 2014

(87) PCT Pub. No.: WO2013/190997
PCT Pub. Date: Dec. 27, 2013

(65) Prior Publication Data
US 2015/0155273 A1    Jun. 4, 2015

(30) Foreign Application Priority Data

Jun. 20, 2012   (JP) .................................. 2012-139202

(51) Int. Cl.
*H01L 29/78* (2006.01)
*H01L 29/10* (2006.01)
(Continued)

(52) U.S. Cl.
CPC ......... *H01L 27/0266* (2013.01); *H01L 21/049* (2013.01); *H01L 21/0455* (2013.01);
(Continued)

(58) Field of Classification Search
USPC .......................................................... 257/76
See application file for complete search history.

(56) References Cited

U.S. PATENT DOCUMENTS

| 4,117,507 A | 9/1978 | Pacor |
| 6,180,959 B1 * | 1/2001 | Iwasaki ............... H01L 29/1608 257/269 |

(Continued)

FOREIGN PATENT DOCUMENTS

| JP | 2000-077662 A | 3/2000 |
| JP | 2003-068759 A | 3/2003 |

(Continued)

OTHER PUBLICATIONS

Notice of Reasons for Rejection mailed by the Japanese Patent Office on Aug. 11, 2015, for corresponding Application No. JP 2014-521281. (With English Translation).

(Continued)

*Primary Examiner* — Long K Tran
*Assistant Examiner* — Thai T Vuong
(74) *Attorney, Agent, or Firm* — Pergament & Cepeda LLP; Milagros A. Cepeda; Edward D. Pergament

(57) ABSTRACT

The present invention provides a semiconductor device that prevents destruction due to an avalanche breakdown and that has a high tolerance against breakdown by configuring the device so as to have a punch-through breakdown function therein and such that the breakdown voltage of a punch-through breakdown is lower than an avalanche breakdown voltage so that an avalanche breakdown does not occur.

19 Claims, 20 Drawing Sheets

(51) Int. Cl.
*H01L 29/423* (2006.01)
*H01L 29/778* (2006.01)
*H01L 27/02* (2006.01)
*H01L 29/417* (2006.01)
*H01L 29/16* (2006.01)
*H01L 27/06* (2006.01)
*H01L 29/872* (2006.01)
*H01L 29/808* (2006.01)
*H01L 29/04* (2006.01)
*H01L 21/04* (2006.01)
*H01L 29/66* (2006.01)
*H01L 29/20* (2006.01)
*H01L 29/47* (2006.01)
*H01L 29/205* (2006.01)

(52) U.S. Cl.
CPC ...... *H01L 27/0248* (2013.01); *H01L 27/0255* (2013.01); *H01L 27/0605* (2013.01); *H01L 27/0629* (2013.01); *H01L 29/04* (2013.01); *H01L 29/045* (2013.01); *H01L 29/1075* (2013.01); *H01L 29/1083* (2013.01); *H01L 29/1087* (2013.01); *H01L 29/1608* (2013.01); *H01L 29/41725* (2013.01); *H01L 29/66068* (2013.01); *H01L 29/7787* (2013.01); *H01L 29/7816* (2013.01); *H01L 29/7835* (2013.01); *H01L 29/7841* (2013.01); *H01L 29/8083* (2013.01); *H01L 29/872* (2013.01); *H01L 29/1066* (2013.01); *H01L 29/1602* (2013.01); *H01L 29/2003* (2013.01); *H01L 29/205* (2013.01); *H01L 29/4236* (2013.01); *H01L 29/475* (2013.01)

(56) References Cited

U.S. PATENT DOCUMENTS

2001/0025961 A1* 10/2001 Nakamura .......... H01L 29/7393
                                                       257/107
2003/0042538 A1   3/2003 Kumar et al.
2004/0227211 A1* 11/2004 Saito .................. H01L 27/0605
                                                       257/578
2004/0251503 A1* 12/2004 Hayashi ............. H01L 29/739
                                                       257/368
2005/0001235 A1   1/2005 Murata et al.
2006/0151806 A1   7/2006 Fukuda et al.
2006/0158801 A1   7/2006 Ritter et al.
2006/0170003 A1*  8/2006 Saito .................... H01L 29/267
                                                       257/189
2010/0109015 A1*  5/2010 Ueno .................... H01L 21/743
                                                       257/76
2010/0148214 A1*  6/2010 Terashima .......... H01L 27/0716
                                                       257/139
2013/0015498 A1*  1/2013 Briere ................. H01L 27/0688
                                                       257/191
2013/0020614 A1*  1/2013 Lu ....................... H01L 29/7787
                                                       257/194

FOREIGN PATENT DOCUMENTS

JP          3524395 B2     5/2004
JP       2004-342907 A    12/2004
JP       2008-258419 A    10/2008
JP          4340757 B2    10/2009
JP       2011-082331 A     4/2011
JP       2012-054324 A     3/2012
JP       2012-104599 A     5/2012

OTHER PUBLICATIONS

Notice of the Opinion on Examination mailed by the Taiwanese Intellectual Property Office on Jul. 20, 2015, for corresponding Application No. 102121422. (With English Translation).
Huang, et al., "Enhancement-Mode n-Channel GaN MOSFETs on p and n-GaN/Sapphire Substrates", IEEE Electron Device Letters, Oct. 2006, pp. 796 to 798, vol. 27-issue No. 10.
International Search Report dated Aug. 20, 2013, for corresponding International Patent Application No. PCT/JP2013/065552.
Written Opinion dated Aug. 20, 2013, for corresponding International Patent Application No. PCT/JP2013/065552.
Extended European Search Report dated Aug. 31, 2016, mailed in the corresponding European Patent Application No. 13 80 6624.

* cited by examiner

SEMICONDUCTOR DEVICE

This application is a National Phase application under 35 U.S.C. 371 of International Application No. PCT/JP2013/065552, filed on Jun. 5, 2013, which claims priority to Japanese provisional application No. 2012-139202, filed on Jun. 20, 2012; all of which are hereby incorporated by reference in their entireties.

TECHNICAL FIELD

The present invention relates to a semiconductor device, and particularly to a power semiconductor device having an improved tolerance against breakdown.

BACKGROUND ART

Power semiconductor devices are mainly used for power converters (DC-DC, AC-DC, DC-AC, and AC-AC), and high-frequency power amplifiers. Up until now, Si power semiconductor devices have been used widely. However, in recent years, it has been pointed out that the performance of Si power semiconductor devices can no longer be improved because of the material properties of Si.

Among properties required of power semiconductor devices, important are three properties, namely a high device withstand voltage, a low On resistance, and a low device capacitance. However, there is a trade-off relationship among these three properties, and when one is improved, the other two tend to deteriorate. This is the cause of the limitation in the improvement of the performance of power semiconductor devices using Si. In order to break through the limitation due to this trade-off, research and development is being promoted worldwide into power semiconductor devices using a wide band gap semiconductor.

In the present invention, a semiconductor satisfying (1) to (3) below is defined as a wide band gap semiconductor.

(1) A wide band gap semiconductor device is a semiconductor of which band gap energy is higher than that of Si (1.1 eV) and GaAs (1.4 eV). Specifically, it is a semiconductor of which band gap energy is 2 eV or higher.

(2) In terms of the composition of the elements forming the crystal, a wide band gap semiconductor is a semiconductor of which main components are boron (B), carbon (C), nitrogen (N), and oxygen (O), which are period 2 elements in the periodic table. Specifically, it is a semiconductor in which the ratio of the period 2 elements in all atoms constituting the crystal is ⅓ or higher.

(3) In terms of properties, a wide band gap semiconductor has a dielectric breakdown strength of 1 MV/cm or higher.

Specific examples of wide band gap semiconductors include silicon carbide, nitride semiconductors, oxide semiconductors, and diamond.

The chemical formula of silicon carbide (hereinafter referred to as SiC) is represented as SiC, and SiC has various polytypes. In particular, in the present specification, SiC means three kinds, namely 4H—SiC, 6H—SiC, and 3C—SiC.

Nitride semiconductors are compound semiconductors made of group III atoms (B, Al, In, and Ga), and nitrogen atoms (N). The total number of group III atoms is equal to the number of nitrogen atoms. The chemical formula of the nitride semiconductor is represented by the formula (1) below.

$$B_xAl_yIn_zGa_{1-x-y-z}N \tag{1}$$

In the formula, x, y, and z have values that satisfy $0 \le x \le 1$, $0 \le y \le 1$, $0 \le z \le 1$, and $x+y+z \le 1$. In particular, GaN, $In_zGa_{1-z}N$ (hereinafter, InGaN), $Al_yGa_{1-y}N$ (hereinafter, AlGaN), and $Al_yIn_zGa_{1-y-z}N$ (hereinafter, AlInGaN) are especially important as the materials of power semiconductor devices. AlN and $B_xAl_{1-x}N$ (hereinafter, BAlN) have a band gap energy of 5 eV or higher, and can be used as a semiconductor and as an insulator at the same time.

Oxide semiconductors are semiconductors of which main component is oxygen atoms (O). Specific examples thereof include ZnO, $Ga_2O_3$, MgO, CdO, NiO, $SnO_2$, $Cu_2O$, $CuAlO_2$, $TiO_2$, $VO_2$, $In_2O_3$, and $SrTiO_3$. Two or more kinds of the oxide semiconductors may be combined to form a mixed crystal. A specific example thereof is ITO used as a transparent electroconductive film. Group II oxide semiconductors are especially effective as the materials of power semiconductor devices, and the chemical formula thereof is represented by the formula (2) below.

$$Zn_xMg_yCd_{1-x-y}O \tag{2}$$

In the formula, x and y have values that satisfy $0 \le x \le 1$, $0 \le y \le 1$, and $x+y \le 1$.

Diamond is an insulator, and at the same time, behaves as a wide band gap semiconductor when a donor and an acceptor are added.

A particularly excellent physical property of the wide band gap semiconductors is a high dielectric breakdown strength. While the dielectric breakdown strength of Si is about 0.2 MV/cm, the dielectric breakdown strength of SiC (about 2 MV/cm), GaN (about 3 MV/cm), and diamond (from 5 to 10 MV/cm), which are wide band gap semiconductors, is about 10 times as high. Therefore, when wide band gap semiconductors are used as power semiconductor devices, the performance of the power semiconductor devices can be improved beyond the trade-off relationship among withstand voltage, On resistance, and device capacitance in the Si power semiconductor devices.

However, wide band gap semiconductor devices when used as power converters have a problem that the devices may be destroyed by a surge voltage. In an application as a power converter, it is when a wide band gap semiconductor device is turned off from an On state to an Off state that a surge voltage beyond the power supply voltage input to the power converter drops. A surge voltage may reach the device withstand voltage of the semiconductor device. In this case, an avalanche breakdown occurs in the semiconductor device, and the device is destroyed if the breakdown state continues.

Hence, wide band gap semiconductor devices need improvement in tolerance against breakdown. Here, tolerance against breakdown is defined as the maximum value of energy that a device can consume without being destroyed, when a voltage beyond the withstand voltage drops in an Off state and there flows a current in the device although it is in the Off state.

FIG. 1 shows a cross-sectional configuration diagram of a metal insulator semiconductor field effect transistor (hereinafter MISFET or insulated-gate field effect transistor) using SiC, as an example of a wide band gap semiconductor device according to a conventional technique. A metal oxide semiconductor field effect transistor (hereinafter, MOSFET) using $SiO_2$ as a gate insulation film is one kind of MISFET.

Breakdown of a semiconductor device will be explained below, by taking the SiC-MISFET of FIG. 1 for example.

FIG. 2 shows a schematic diagram of a current-voltage characteristic of the SiC-MISFET shown in FIG. 1. As shown in FIG. 2, when a positive Vds is applied during an On state, there flows a drain current from a drain to a source. Here, Vds is an electric potential of a drain electrode with respect to an electric potential of a source electrode. On the other hand, when a Vds is applied during an Off state, there first flows a weak drain current that is attributed to a reverse leakage current in a body diode between a P-type region 222 and an N-type conductive region 203. After this, the Vds is raised, and when the Vds reaches a predetermined voltage Vava, an avalanche breakdown occurs, and the drain current increases sharply. As shown in FIG. 1, this avalanche breakdown current flows from the drain electrode 212 to the source electrode 210 along a breakdown current path 220.

Here, a device withstand voltage is a voltage at which a current that has started to flow during an Off state makes it no more possible for the Off state to be maintained. The withstand voltage of the SiC-MISFET of FIG. 1 is determined by the avalanche breakdown voltage Vava.

An avalanche breakdown is a phenomenon of a current flowing through a semiconductor device although the device is in an Off state, caused when en electric field strength in the semiconductor device reaches a value comparable to the dielectric breakdown strength of the semiconductor, and generation of electrons and holes becomes significant by avalanche multiplication. In the example of FIG. 1, generated holes migrate along the breakdown current path 220 and are eliminated from the source electrode 210, and electrons migrate along the breakdown current path 220 in a reverse direction and are eliminated from the drain electrode 212.

There are the following three factors due to which a wide band gap semiconductor device as a power converter is destroyed by an avalanche breakdown.

As a first factor, a surge voltage is more likely to occur in a wide band gap semiconductor device than in a Si power device. When a surge voltage above the device withstand voltage occurs, a breakdown state occurs. The magnitude of a surge voltage depends on a floating inductance (Ls) in the circuit and an amount of change of a drain current $i_d$ per time ($di_d/dt$), and is proportional to $Ls \times di_d/dt$. A wide band gap semiconductor device has a small device capacitance, and can be switched at a high speed. Therefore, it has a high $di_d/dt$ value, and as a result, a surge voltage in the device is inherently high. Further, since the device capacitance is small, a surge voltage that occurs due to energy accumulated in the floating inductance is high, even if the accumulated energy is low. This is an unavoidable problem of a wide band gap semiconductor device that can be switched at a high speed.

As a second factor, a device is destroyed due to local concentration of an avalanche breakdown current in the device. In a wide band gap semiconductor device, an avalanche breakdown cannot occur uniformly throughout the device, and the breakdown current tends to concentrate. This problem is attributed to the fact that a P type and an N type of a wide band gap semiconductor cannot have low resistivities at the same time. Particularly, SiC, a nitride semiconductor, and an oxide semiconductor have a high resistivity when they are a P-type wide band gap semiconductor. Therefore, electrons and holes from inside the device, which are generated by avalanche multiplication, cannot be eliminated efficiently. As a result, a breakdown current concentrates at the location at which an avalanche breakdown started, and the device is destroyed at the location of the concentration.

As a third factor, a protective insulation film protecting the surface of a semiconductor device is destroyed. A dielectric breakdown strength of a wide band gap semiconductor is comparable to a dielectric breakdown strength of a protective insulation film such as $SiO_2$ used commonly. Hence, when a strong electric field that would cause an avalanche breakdown is applied, a dielectric breakdown occurs in the protective insulation film not in the semiconductor.

A specific example of the destruction due to the second factor will be explained, by taking the SiC-MISFET of FIG. 1 for example. An electric field is applied to the body diode formed between the P-type region 222 and the N-type conductive region 203, and an avalanche breakdown occurs. Holes generated by the avalanche migrate along the breakdown current path 220, and are injected into a P-type contact region 206 and eliminated from the source electrode 210. At this moment, a diode between the P-type contact region 206 and an N-type contact region 205 is turned On by a voltage drop in the P-type region 222 and the P-type contact region 206 that have a high resistance. Due to this, electrons are injected from the source electrode 210 via the N-type contact region 205, to thereby further increase the breakdown current. As a result, the breakdown current concentrates at the predetermined location in the device, leading to a local destruction. That is, a MISFET, which is a unipolar device, incurs minority carrier injection and behaves as a bipolar device during a breakdown state. The current concentration in the device during a behavior as a bipolar device causes device destruction.

Due to the second factor, wide band gap semiconductor devices characterized in that the carriers carrying an On current during an On state are electrons have particularly outstanding avalanche breakdown destruction.

In FIG. 1, a reference sign 200 denotes a substrate, a reference sign 207 denotes an N-type contact region, a reference sign 211 denotes a gate electrode, and a reference sign 224 denotes a gate insulation film. In the present specification, the same reference numerals denote members having the same names.

As another specific example of a destruction due to the second factor, a heterojunction field effect transistor (hereinafter, HFET, or a heterojunction field effect transistor) using a nitride semiconductor will be explained. A cross-sectional configuration diagram of a nitride semiconductor HFET is shown in FIG. 3. As shown in this drawing, a nitride semiconductor HFET typically does not include a body diode formed of a PN junction. Hence, it does not include a path through which a breakdown current flows. In this case, it does not include a P-type region and an electrode for the P-type region through which holes generated by an avalanche are eliminated, which makes it harder for the holes to be eliminated. As a result, holes generated by avalanche multiplication are accumulated in the device. The hole accumulation induces electric field concentration, to thereby let an avalanche breakdown current flow locally concentratively in the device. Hence, the device is destroyed even by a weak avalanche current. In FIG. 3, a reference sign 103 denotes an N-type conductive region, a reference sign 110 denotes a source electrode, a reference sign 111 denotes a gate electrode, a reference sign 112 denotes a drain electrode, a reference sign 117 denotes a substrate electrode, a reference sign 124 denotes a gate insulation film, a reference sign 133 denotes a 2D electron gas, a reference sign 134 denotes a surface barrier layer, a reference sign 135 denotes a GaN foundation layer, a reference sign 136 denotes an initial growth layer, and a reference sign 137 denotes a heterogeneous substrate.

Notwithstanding the above said, there are also disclosed nitride semiconductor configurations including a body diode formed of a PN junction (NPL 1 and PTL 1). These devices are destroyed by concentration of an avalanche breakdown current due to a high resistivity in a P type, as is the SiC-MISFET of FIG. 1.

PTL 2 discloses a wide band gap semiconductor configuration having an improved tolerance against an avalanche breakdown. However, the fundamental problem of an avalanche breakdown in a wide band gap semiconductor described above is not resolved.

The problem of destruction of a wide band gap semiconductor device due to an avalanche breakdown in the device has been explained by taking the SiC-MISFET of FIG. 1 and the nitride semiconductor HFET of FIG. 3 for examples. However, destruction of a wide band gap semiconductor device due to an avalanche breakdown is a problem shared in common among various wide band gap semiconductor devices, which is attributed to a high surge voltage, a uniform avalanche breakdown in the whole device, and deterioration of an insulation film by a strong electric filed that would not cause an avalanche breakdown, as described above.

Specifically, unipolar and bipolar devices have the same problem. Here, a unipolar device is a semiconductor device that satisfies the following two conditions. As a first condition, it is a semiconductor device in which carriers to carry an On current to flow through main electrodes during an On state are either electrons or holes. As a second condition, at the moment, electrons or holes pass only an N-type semiconductor or a P-type semiconductor respectively in the semiconductor. The semiconductor devices of FIG. 1 and FIG. 3 are classified as unipolar devices in which carriers are electrons. Here, an N-type semiconductor and a P-type semiconductor include an inverted N-type layer and an inverted P-type layer at the interface between an insulation film and the semiconductor, respectively. Devices that do not satisfy the above two conditions are referred to as bipoar devices.

Here, main electrodes means source and drain electrodes of a field effect transistor, emitter and collector electrodes of a bipolar transistor, and cathode and anode electrodes of a diode.

More specifically, wide band gap devices described below have the same problem. A junction field effect transistor (hereinafter, JFET, or a junction-type field effect transistor), and a static induction transistor (hereinafter, SIT, or a static induction-type transistor), which are transistors classified as unipolar devices, have the same problem.

A bipolar transistor (hereinafter, BT, or a bipolar transistor), a heterojunction bipolar transistor (hereinafter, HBT, or a heterojunction-type bipolar transistor), and an insulated gate bipolar transistor (hereinafter, IGBT, or an insulated gate-type bipolar transistor), which are power transistors classified as bipolar devices, have the same problem.

Diodes also have the same problem; a Schottky barrier diode (hereinafter, SBD, or a Schottky barrier diode) and a junction barrier Schottky diode (hereinafter, JBSD, one variety of Schottky barrier diode), which are unipolar devices, and a P—N junction diode (hereinafter, PND) and a P-i-N junction diode (PiND), which are bipolar devices, have the same problem.

Unipolar devices have a switching speed higher than that of bipolar devices, and the problem of destruction due to an avalanche breakdown is more outstanding in the unipolar devices.

Further, the problem due to an avalanche breakdown is more outstanding in a lateral semiconductor device than in a vertical semiconductor device for the following two reasons. For a first reason, a lateral semiconductor device has a switching speed higher than that of a vertical semiconductor device, and incurs a high surge voltage as a result. For a second reason, high energy carriers generated by an avalanche breakdown flow through the surface of the semiconductor device and are injected into an insulation film protecting the surface of the semiconductor device, to thereby cause concentration of an electric field in the insulation film, leading to a destruction in the insulation film.

Here, a vertical device is a semiconductor device that has main electrodes on both sides of a semiconductor substrate, to thereby let an On current flow by penetrating through the semiconductor substrate. A lateral device is a semiconductor device that has main electrodes on either side of a semiconductor substrate. FIG. 1 and FIG. 3 show lateral semiconductor devices.

CITATION LIST

Patent Literature

PTL 1: Japanese Patent Application Laid-Open (JP-A) No. 2011-82331
PTL 2: JP-A No. 2004-342907

Non-Patent Literature

NPL 1: W. Huang, T. Khan, and T. P. Chow, IEEE ELECTRON DEVICE LETTERS, Vol. 27, pp. 796-798, 2006

SUMMARY OF INVENTION

Technical Problem

An object of the present invention is to prevent destruction of a power semiconductor device due to an avalanche breakdown and thereby provide a power semiconductor device having an improved tolerance against breakdown.

Solution to Problem

The present invention prevents destruction of a semiconductor device due to an avalanche breakdown, and thereby provides a semiconductor device having a high tolerance against breakdown. Specifically, the problems described above are solved by providing the following semiconductor device.

In one aspect, the present invention provides a semiconductor device, having a semiconductor structure configured to let a breakdown current occur due to a punch-through breakdown.

In one variant, the present invention provides a semiconductor device according to the present invention, wherein a breakdown voltage of the punch-through breakdown is lower than an avalanche breakdown voltage.

In one variant, the present invention provides a semiconductor device according to the present invention, wherein the semiconductor device is a unipolar transistor or a unipolar diode.

In one variant, the present invention provides a semiconductor device according to the present invention, wherein a semiconductor of the semiconductor structure is a wide band gap semiconductor.

In one variant, the present invention provides a semiconductor device according to the present invention, wherein the breakdown current flows by passing through a heterojunction interface having polarized charges having a same polarity as that of carriers carrying the breakdown current.

In one variant, the present invention provides a semiconductor device according to the present invention, wherein a semiconductor of the semiconductor structure has a hexagonal crystal structure, and the breakdown current flows in a direction of a c-axis of the semiconductor.

In one variant, the present invention provides a semiconductor device according to the present invention, wherein the semiconductor structure is composed of a first semiconductor region disposed over a substrate and having a first conductivity type, a second semiconductor region having the first conductivity type, and a third semiconductor region located between the first and second semiconductor regions and having a second conductivity type, wherein the semiconductor device includes a first electrode having an ohmic characteristic with respect to the first semiconductor region, a second electrode having an ohmic characteristic with respect to the second semiconductor region, and a third electrode adjoining the second electrode, wherein when a voltage positive or negative with respect to the first and third electrodes is applied to the second electrode during an On state, an On current by carriers having the first conductivity type flows between the second and third electrodes, wherein when a voltage positive or negative with respect to the first and third electrodes is applied to the second electrode during an Off state, the breakdown current by carriers having the first conductivity type flows between the second electrode and the first electrode, and wherein a current value of a leakage current flowing between the second and third electrodes is at most equal to or less than $1/1,000$ of a current value of the On current.

In one variant, the present invention provides a semiconductor device according to the present invention, wherein a punch-through breakdown occurs by depletion of the third semiconductor region located between the substrate and the second electrode.

In one variant, the present invention provides a semiconductor device according to the present invention, wherein the first electrode is electrically short-circuited with the third electrode.

In one variant, the present invention provides a semiconductor device according to the present invention, wherein the third semiconductor region is electrically floating.

In one variant, the present invention provides a semiconductor device according to the present invention, wherein the semiconductor device is a field effect transistor, wherein the second electrode is a drain electrode, and the third electrode is a source electrode, and wherein the semiconductor device further includes a gate electrode as a fourth electrode between the second electrode and the third electrode.

In one variant, the present invention provides a semiconductor device according to the present invention, wherein the semiconductor device is a Schottky barrier diode, wherein the second electrode is a cathode electrode, and the third electrode is an anode electrode having a Schottky characteristic with respect to the second semiconductor layer.

In one variant, the present invention provides a semiconductor device according to the present invention, wherein the semiconductor device, which is a transistor, is cascoded with another transistor in which an avalanche breakdown occurs, by the source electrode being short-circuited with a drain electrode of the another transistor.

Advantageous Effects of Invention

According to the present invention, it is possible to realize a semiconductor device having an improved tolerance against breakdown, by providing a punch-through breakdown function in the semiconductor device. When a surge voltage drops, a semiconductor device in which a punch-through function is provided can let a punch-through breakdown occur at a high response speed and uniformly throughout the device. As a result, the semiconductor device can be prevented from destruction.

Here, a punch-through breakdown is a phenomenon in a semiconductor structure in which two semiconductor regions having a first conductivity type are PN junction-isolated from each other by means of at least one or more semiconductor region formed between the two semiconductor regions and having a second conductivity type, and ohmic electrodes are formed over the two semiconductor regions having the first conductivity type, respectively. When a positive or negative voltage is applied between the two ohmic electrodes, the semiconductor region having the second conductivity type is partially or wholly depleted to get the two semiconductor regions having the first conductivity type connected with each other through the depletion layer, which causes a current to flow between the two electrodes. This is the punch-through breakdown.

In one aspect of the present invention, it is possible to prevent destruction due to an avalanche breakdown and to thereby realize a highly reliable semiconductor device.

In one aspect of the present invention, a unipolar semiconductor device having a punch-through breakdown function can realize a behavior as a unipolar device including a breakdown state. Hence, when a surge voltage drops, the semiconductor device can let a punch-through breakdown occur at a high response speed and uniformly throughout the device.

In one aspect of the present invention, it is possible to solve the problem of avalanche breakdown in a semiconductor device made of a wide band gap semiconductor. Further, when a surge voltage drops, the semiconductor device can let a punch-through breakdown occur at a high response speed and uniformly throughout the device.

In one aspect of the present invention, a breakdown current flows by passing through a heterojunction interface having polarized charges having the same polarity as that of the carriers carrying the breakdown current. This makes it possible to prevent variation of a punch-through breakdown voltage due to temperature variation, and to realize a highly reliable semiconductor device in a broad temperature range. Here, the polarity of a carrier is negative for an electron, and positive for a hole. That is, when the carriers carrying a breakdown current are electrons, the breakdown current flow by passing through a hetero-interface having negatively polarized charges. When the carriers carrying a breakdown current are holes, the breakdown current flows by passing through a hetero-interface having positively polarized charges.

In one aspect of the present invention, it is possible to improve performance of a semiconductor device having the punch-through breakdown function of the present invention, by letting a breakdown occur in a c-axis direction in which a dielectric constant is higher than a dielectric constant in an a-axis direction, and thereby improving a trade-off relationship between an avalanche breakdown voltage and a characteristic On resistance in the semiconductor device. Further, this makes it possible to save the chip area of the device and to suppress the production costs of the device.

In one aspect of the present invention, when a surge voltage drops, a semiconductor device can let a punch-through breakdown occur at a high response speed and uniformly throughout the device. Hence, the semiconductor device can be prevented from destruction.

In one aspect of the present invention, the third semiconductor region located between the substrate and the second electrode perpendicularly below the second electrode can be depleted and get the first and second semiconductor regions connected through the depletion layer, to thereby cause a punch-through breakdown and suppress an electric field and a breakdown current near the surface of the semiconductor device, which leads to further improvement of the reliability of the device. In this case, the breakdown current flows from the second electrode toward the substrate in a direction perpendicular to the surface of the substrate. Therefore, an electric field and a breakdown current near the surface of the semiconductor device can be suppressed.

In one aspect of the present invention, the first electrode is electrically short-circuited with the third electrode in the semiconductor device. Therefore, the On resistance of the device can be suppressed.

In one aspect of the present invention, the third semiconductor region is electrically floating in the semiconductor device. Therefore, the production cost of the device can be suppressed.

In one aspect of the present invention, when a surge voltage drops in a transistor, the transistor can let a punch-through breakdown occur at a high response speed and uniformly throughout the device.

In one aspect of the present invention, when a surge voltage drops in a Schottky barrier diode, the diode can let a punch-through breakdown occur at a high response speed and uniformly throughout the device.

In one aspect of the present invention, a circuit in which a transistor configured to cause the punch-through breakdown is cascoded with another transistor in which an avalanche breakdown occurs can be prevented from destruction and can realize a high reliability.

DESCRIPTION OF EMBODIMENTS

Best modes (hereinafter, referred to as embodiments) for carrying out the invention will be explained. Hereinafter, particularly, a HFET made of a nitride semiconductor will be explained in the first embodiment, a MISFET made of SiC will be explained in the second embodiment, a JFET made of SiC will be explained in the third embodiment, and a SBD made of a nitride semiconductor will be explained in the fourth embodiment. All of these are semiconductor devices that use a wide band gap semiconductor as a material, that are unipolar devices, in which electrons are the carriers, and that are lateral devices. The present invention is applicable to devices made of various materials including bipolar devices. However, the present invention is particularly effective for unipolar semiconductor devices, and even more effective for unipolar devices in which electrons are the carriers. By applying the present invention to a unipolar device, it is possible to realize a complete unipolar behavior including a breakdown state. Further, the present invention is effective for a semiconductor device using a wide band gap semiconductor, and is the most effective for a lateral wide band gap semiconductor device.

Further, as will be described in the fifth embodiment, it is possible to realize a highly reliable integrated circuit by integrating semiconductor devices according to the present invention on the same substrate.

Example 1

Figure 1:
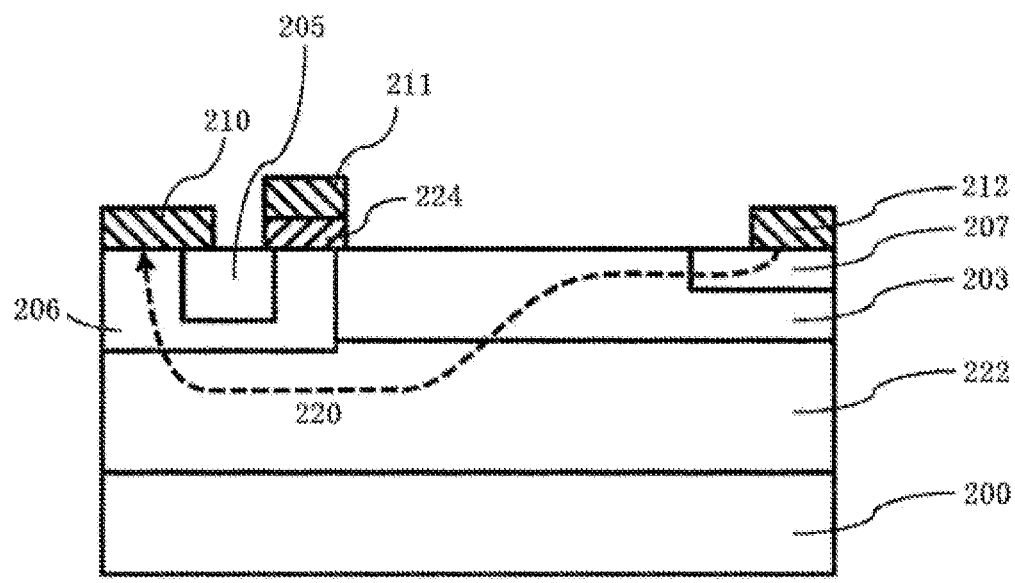
FIG. 1 is a cross-sectional configuration diagram of a SiC-MISFET according to a conventional art.
Figure 2:
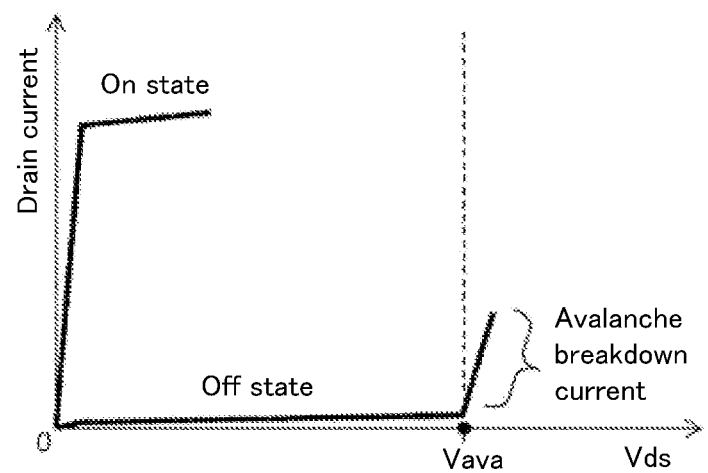
FIG. 2 is a schematic diagram of an I-V characteristic explaining a behavior of the SiC-MISFET shown in FIG. 1.
Figure 3:
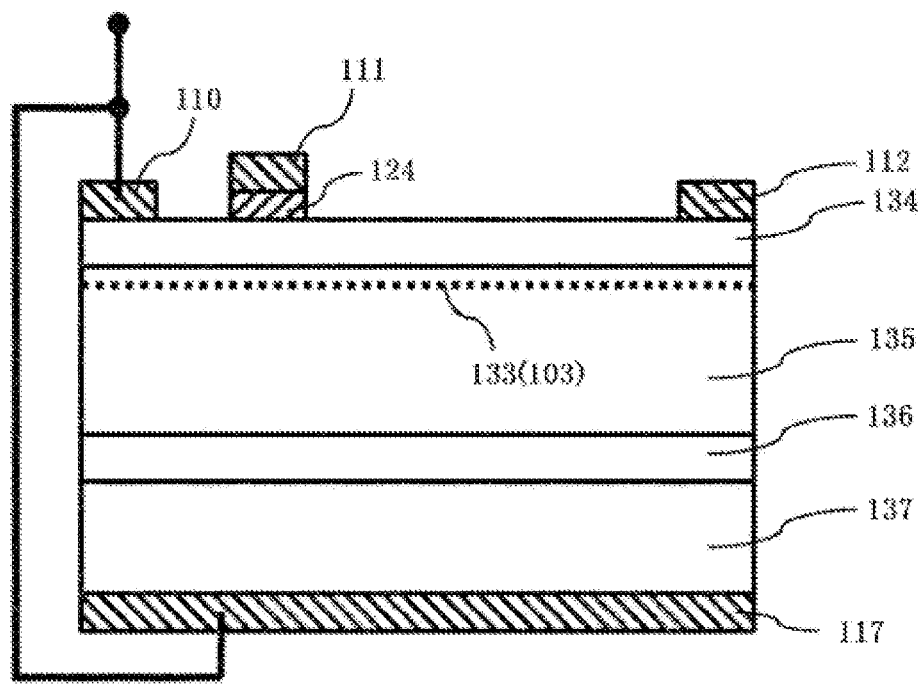
FIG. 3 is a cross-sectional configuration diagram of a nitride semiconductor HFET according to a conventional art.
Figure 4:
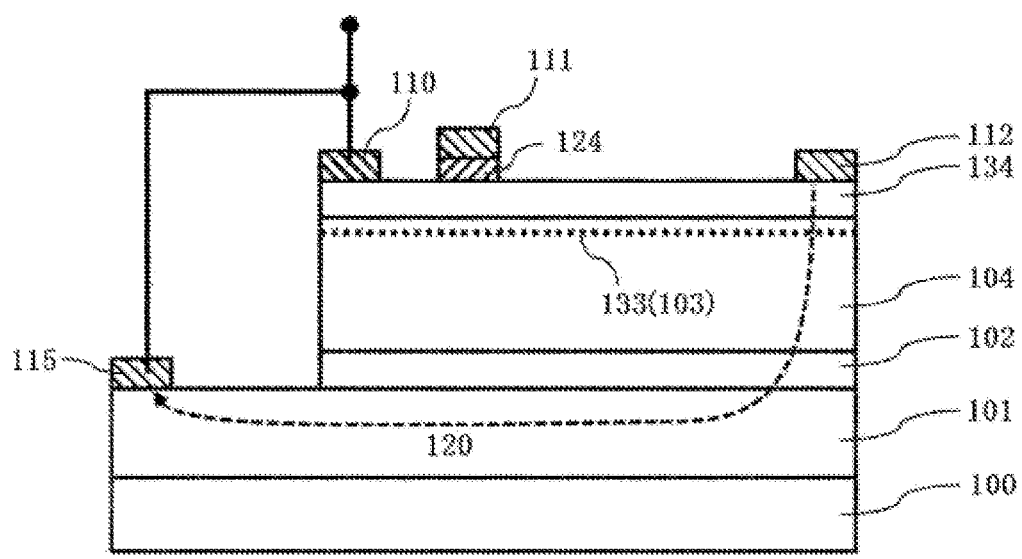
FIG. 4 is a cross-sectional configuration diagram of a nitride semiconductor HFET according to a first embodiment.

In the first embodiment of the present invention, a HFET made of a nitride semiconductor, which is the first embodiment, will be explained. FIG. 4 shows a configuration diagram of a nitride semiconductor HFET according to the present invention. The semiconductor material of the HFET except for a substrate 100 is a nitride semiconductor having a chemical formula represented by the following formula (3).

In the formula, x, y, and z have values that satisfy $0 \leq x \leq 1$, $0 \leq y \leq 1$, $0 \leq z \leq 1$, and $x+y+z \leq 1$. The material of the substrate 100 needs not be a nitride semiconductor.

It is preferable that the layer structure of the present invention be formed in a c-axis direction of a hexagonal crystal structure. The c-axis direction is a [0001] or [000–1] direction.

It is preferable that the material of the substrate 100 be a material over which a high-quality crystal growth of a nitride semiconductor can be realized. Examples of the material include a Si substrate, a SOI (Silicon-on-Insulator) substrate, a SOS (Silicon-on-Sapphire) substrate, a sapphire substrate, a SiC substrate, a diamond substrate, and a nitride semiconductor substrate. A preferable plain orientation of the substrate is a (0001) plane or a (000–1) plane of a hexagonal crystal system, and a (111) plane of a cubic crystal system. With this feature, it is possible to form the layer structure shown in FIG. 4 in a c-axis direction.

An N-type carrier supply region 101 is formed over the substrate 100. The N-type carrier supply region 101 is made of a nitride semiconductor having N-type conductivity. It is preferable that the N-type carrier supply region 101 be made of N-type InAlGaN, AlGaN, GaN, InAlN, or InGaN. This region may also be a multilayer film formed of two or more kinds of nitride semiconductor layers having different compositions. In order to impart the N-type conductivity to this region, it is preferable to dope the region with a donor impurity, and it is more preferable to dope the region with Si. The Si doping concentration is preferably $5 \times 10^{16}$ cm$^{-3}$ or higher, and more preferably $3 \times 10^{17}$ cm$^{-3}$ or higher. However, depending on the growth conditions, it is possible to obtain an N-type nitride semiconductor without doping. Therefore, it is possible to produce the N-type carrier supply region 101 without doping. The film thickness of the N-type carrier supply region 101 is preferably 10 nm or greater, and more preferably 100 nm or greater.

A P-type barrier region 102 is formed over the N-type carrier supply region 101. It is preferable that the P-type barrier region 102 be made of P-type InAlGaN, AlGaN, GaN, InAlN, or InGaN. This region may also be a multilayer film formed of two or more kinds of nitride semiconductor layers having different compositions. In order to provide this region with P-type conductivity, it is preferable to dope the region with an acceptor impurity, and it is more preferable to dope the region with Mg. The Mg doping concentration is preferably $1 \times 10^{16}$ cm$^{-3}$ or higher, and more preferably $3 \times 10^{16}$ cm$^{-3}$ or higher. When the Mg concentration is increased, a hole activation rate at or about room temperature falls. Hence, due to heat generation at the location at which a breakdown occurs in the device, the hole activation rate rises, which automatically suppresses the punch-through breakdown. Therefore, the breakdown can occur uniformly throughout the device. However, an excessively high Mg concentration leading to an activation rate fall accompanies an excessive punch-through breakdown voltage variation due to temperature variation. In the worst case, the punch-through breakdown voltage rises as the temperature rises and may reach an avalanche breakdown voltage. Therefore, the Mg concentration is preferably $2 \times 10^{19}$ cm$^{-3}$ or lower, and more preferably $5 \times 10^{18}$ cm$^{-3}$ or lower. Further, it is possible to suppress temperature variation by using InGaN in which the In composition is from 2% to 30% for the N-type carrier supply region 101.

A low-concentration withstand voltage control region 104 is formed over the P-type barrier region 102. The low-concentration withstand voltage control region 104 is made of a low-concentration P-type, a low-concentration N-type, and a semi-insulating nitride semiconductor. It is preferable that the low-concentration withstand voltage control region 104 be made of InAlGaN, AlGaN, GaN, InAlN, or InGaN having a low carrier concentration. This region may also be a multilayer film formed of two or more nitride semiconductor layers having different compositions. For example, the low-concentration withstand voltage control region 104 may be formed of a superlattice structure obtained by repeatedly layering a GaN layer and an AlGaN layer, or a GaN layer and an AlN layer alternately. It is preferable to produce this region without doping, in order to suppress the carrier concentration. However, it is possible to add a Si donor or a Mg acceptor at a low concentration. It is also possible to add an impurity such as O and C that forms a deep level, in order to impart a high resistivity to this region. The carrier concentration is preferably $1 \times 10^{16}$ cm$^{-3}$ or lower, and more preferably $5 \times 10^{15}$ cm$^{-3}$ or lower. The film thickness is an important parameter that determines the withstand voltage, and needs to be designed depending on the withstand voltage. When the withstand voltage is 200 V or higher, the film thickness is 0.5 μm or greater. When the withstand voltage is 600 V or higher, the film thickness is 1.5 μm or greater.

A surface barrier layer 134 is formed over the low-concentration withstand voltage control region 104. With positively polarized charges induced at the heterojunction interface between the low-concentration withstand voltage control region 104 and the surface barrier layer 134, a two-dimensional electron gas 133 is formed. It is possible to obtain a two-dimensional electron gas 133 having a high density by forming the surface barrier layer 134 from a nitride semiconductor layer having a band gap greater than that of the low-concentration withstand voltage control region 104. It is preferable that the film thickness of the surface barrier layer 134 be in the range of from 2 nm to 70 nm.

During an On state of the device, electrons, which are carriers, flow from a source electrode 110 to a drain electrode 112 via the two-dimensional electron gas 133. Hence, the two-dimensional electron gas 133 serves the function of an N-type conductive region 103. The surface barrier layer 134 may be wholly or partially doped with Si, which makes it possible to increase the carrier density of the two-dimensional electron gas 133 and reduce the On resistance of the device. In this case, the Si doping concentration is preferably $5 \times 10^{19}$ cm$^{-3}$ or lower, and more preferably $1 \times 10^{19}$ cm$^{-3}$. However, the positive polarization at the hetero-interface makes it possible to form the two-dimensional electron gas 133 without doping. Therefore, the surface barrier layer 134 may be produced without doping. Further, the surface barrier layer 134 may be a multilayer film formed of two or more nitride semiconductor layers having different compositions. Specifically, the surface barrier layer 134 may be formed of a two-layered structure made of InGaN/InAlGaN, or the surface barrier layer 134 may be formed of a two-layered structure made of GaN/AlGaN.

Here, a two-dimensional electron gas means electrons that are induced by positively polarized charges at a heterojunction interface and distributed two-dimensionally near the heterojunction interface.

The sheet electron concentration in the N-type conductive region 103 at 300 K is $5 \times 10^{12}$ cm$^{-2}$ or higher, and more preferably $1 \times 10^{13}$ cm$^{-2}$ or higher. It is preferable that the sheet electron concentration in the N-type conductive region 103 be higher than the sheet hole concentration in the P-type barrier region 102. This makes it possible to let a punch-through breakdown occur stably. Here, a sheet electron concentration (unit: cm$^{-2}$) is a value obtained by integrating the electron concentration (unit: cm$^{-3}$) in the N-type conductive region 103 in a direction perpendicular to the surface of the substrate.

A punch-through electrode 115 forms an ohmic contact with the N-type carrier supply region 101 in terms of electron exchange. The material of the punch-through electrode 115 may be a Ti-based alloy.

The drain electrode 112 forms an ohmic contact with the N-type conductive region 103 in terms of electron exchange. The material of the drain electrode 112 may be a Ti-based alloy.

The source electrode 110 forms an ohmic contact with the N-type conductive region 103 in terms of electron exchange. The material of the source electrode 110 may be a Ti-based alloy.

As shown in FIG. 4, the punch-through electrode 115 and the source electrode 110 are electrically short-circuited with each other.

A gate electrode 111 is formed over a gate insulation film 124 formed over the surface barrier layer 134. Hence, a gate having a MIS structure is formed. The gate electrode 111 may be made of various materials, and examples thereof include a Ni-based alloy and a Pt-based alloy. The material of the gate insulation film 124 is not particularly limited. Examples thereof include $SiO_2$, SiNx, $Al_2O_3$, AlN, and diamond. AlN and diamond are semiconductors, and at the same time can be used as an insulation film.

The gate electrode 111 may be formed in contact with the surface barrier layer 134, to function as a Schottky electrode with respect to the N-type carrier supply region 103.

The horizontal distance between the source electrode 110 and the gate electrode 111 is 5 μm or less, and preferably 2 μm or less. It is preferable that the horizontal distance between the gate electrode 111 and the drain electrode be greater than the film thickness of the low-concentration withstand voltage control layer 104, and it is more preferable that the horizontal distance be 1.2 or more times as great as the film thickness of the low-concentration withstand voltage control layer.

There are no electrodes that form an ohmic contact and an indirect ohmic connection with the P-type barrier region 102. Therefore, the P-type barrier region 102 is PN-junction-isolated from all of the electrodes by means of the N-type conductive region 103 and the N-type carrier supply region 101, and is electrically floating. This makes it possible to save the production cost of the device significantly.

Figure 5:
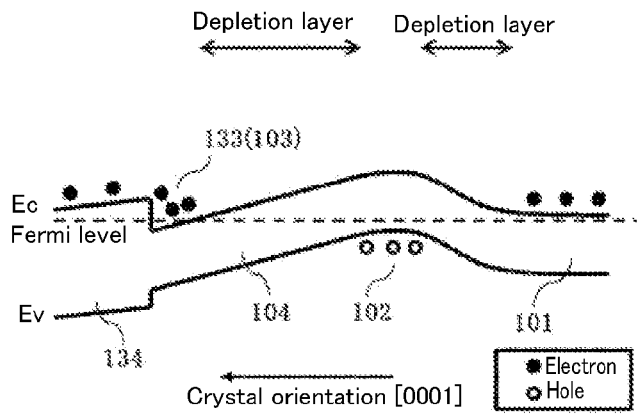
FIG. 5 is a schematic diagram of a band structure below a drain electrode of the nitride semiconductor HFET of FIG. 4 during zero bias.

FIG. 5 shows a schematic diagram of a profile of a band structure in a semiconductor region of the nitride semiconductor HFET shown in FIG. 4 located below the drain electrode 112 in a direction perpendicular to the surface of the substrate during zero bias (Vds=0 V). It is preferable that the width of a depletion layer between the N-type conductive region 103 and the P-type barrier region 102 be greater than the width of a depletion layer between the P-type barrier region 102 and the N-type carrier supply region 101. Specifically, the former width is twice or more times as great as the latter width, and more preferably 5 or more times as great.

Figure 6:
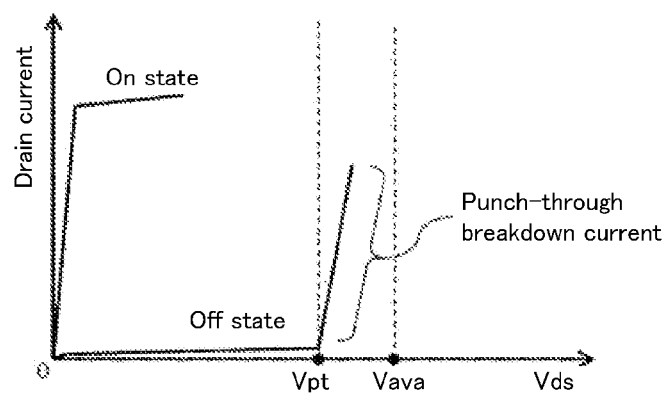
FIG. 6 is a schematic diagram of an I-V characteristic explaining a behavior of the nitride semiconductor HFET of FIG. 4.

An operation of the nitride semiconductor HFET shown in FIG. 4 will be explained below. FIG. 6 shows a schematic diagram of an I-V characteristic of this nitride semiconductor HFET. First of all, during an On state in which a voltage equal to or higher than a threshold voltage is applied between the gate electrode 111 and the source electrode 110 shown in FIG. 4, electrons are carried from the source electrode 110 toward the drain electrode 112 via the N-type conductive region 103. As the electrons have negative charges, an On current flows from the drain electrode 112 toward the source electrode 110.

Next, during an Off state in which a voltage equal to or lower than the threshold voltage is applied between the gate electrode 111 and the source electrode 110 shown in FIG. 4, the two-dimensional electron gas 133 below the gate electrode 111 is depleted. When a positive voltage Vds is applied between the drain 112 and the source 110 in this state, a weak leakage current as depicted in FIG. 6 flows. The value of the leakage current is equal to or less than $\frac{1}{1,000}$, and more preferably equal to or less than $\frac{1}{10,000}$ of the maximum value of the drain current during an On state.

As the voltage Vds is increased, hole depletion occurs at a portion of the P-type barrier layer 102, particularly at a portion located perpendicularly below the drain electrode 112. When the voltage Vds reaches a punch-through breakdown voltage (hereinafter, Vpt), the N-type conductive region 103 and the N-type carrier supply region 101 get connected with each other through a depletion layer, to thereby bring about a punch-through breakdown state. As a result, electrons are injected from the punch-through electrode 115, and they pass through the N-type carrier supply region 101 and the hole-depleted portion of the P-type barrier region 102 and reach the drain electrode 112. This path 120 of the punch-through breakdown current is reverse to the flow of electrons having negative charges. By the occurrence of the punch-through, a drain current flows at a Vds higher than Vpt as shown in FIG. 6, although the device is in an Off state.

Figure 7:
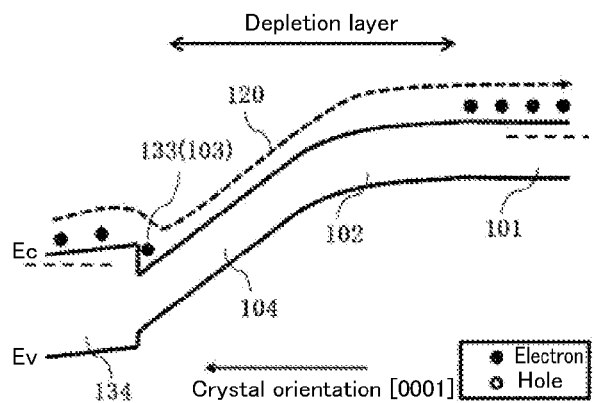
FIG. 7 is a schematic diagram of a band structure below a drain electrode of the nitride semiconductor HFET of FIG. 4 during a punch-through breakdown.

FIG. 7 shows a schematic diagram of a profile of a band structure in a semiconductor region located below the drain electrode 112 in a direction perpendicular to the surface of the substrate during a punch-through breakdown. As shown in FIG. 7, the P-type barrier region 102 located below the drain electrode 112 is depleted, and a breakdown current flows along the direction of the breakdown current path 120 in the c-axis direction.

In this punch-through breakdown state, a current flows from the drain electrode 112 toward the punch-through electrode 115, and substantially no currents flow between the drain electrode 112 and the source electrode 110 and between the drain electrode 112 and the gate electrode 111. Specifically, any currents that may flow between the drain electrode 112 and the source electrode 110 and between the drain electrode 112 and the gate electrode 111 are equal to or less than $\frac{1}{1,000}$, and more preferably equal to or less than $\frac{1}{10,000}$ of the current flowing from the drain electrode 112 toward the punch-through electrode 115.

The voltage Vpt of the semiconductor device of the present invention is designed so as to be lower than an avalanche breakdown voltage (hereinafter, Vava), so as not for an avalanche breakdown to occur. This makes it possible to prevent destruction due to an avalanche breakdown. The device withstand voltage (hereinafter, BV) of the semiconductor device of the present invention is determined by Vpt.

Here, BV of the semiconductor device is a voltage at which an Off state can no longer be maintained and a current starts to flow. In a FET, BV is a voltage Vds between a drain and a source at which a drain current starts to flow.

Although not shown in FIG. 6, when an overvoltage equivalent to Vpt is applied during an On state, a punch-through breakdown current flows from the drain electrode 112 toward the punch-through electrode 115 as does during an Off state. Therefore, an avalanche breakdown can be prevented also during an On state.

Figure 8:
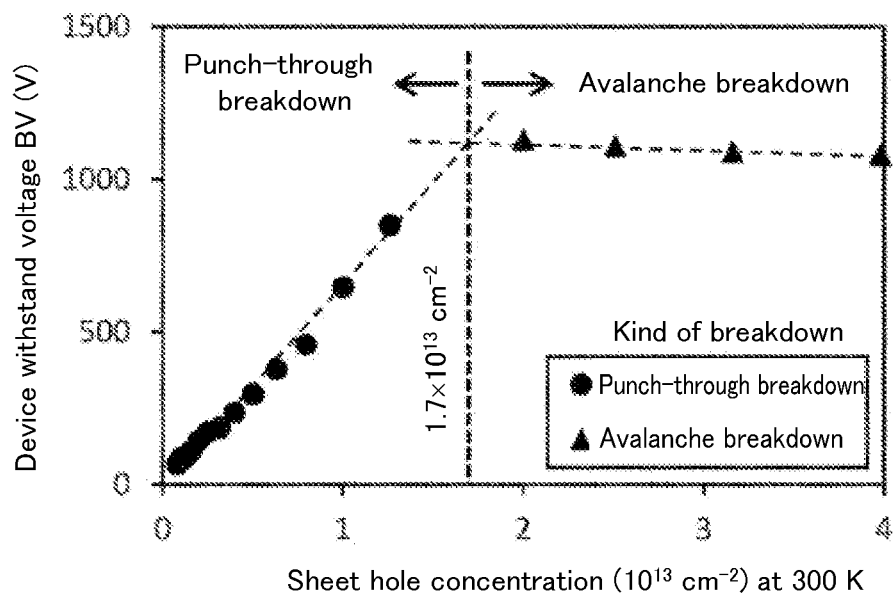
FIG. 8 shows a result of simulation of a device withstand voltage of the nitride semiconductor HFET of FIG. 4 at 300 K.

The BV value of the nitride semiconductor HFET of FIG. 4 with respect to the sheet hole concentration in the P-type carrier supply region 102 at 300 K was examined based on a device simulation virtual experiment. FIG. 8 shows the result of the simulation. Breakdowns due to punch-through occurred at a sheet hole concentration of $1.7 \times 10^{13}$ cm$^{-2}$ or lower, whereas avalanche breakdowns occurred at a sheet hole concentration equal to or higher than that. Hence, the sheet hole concentration of the semiconductor device of the present invention made of a nitride semiconductor is $1.7 \times 10^{13}$ cm$^{-2}$ or lower. Here, a sheet hole concentration (unit: cm$^{-2}$) is a value obtained by integrating the hole concentration (unit: cm$^{-3}$) in the P-type barrier region 102 located below the drain electrode 112 in a direction perpendicular to the surface of the substrate. Note that a hole concentration can be measured according to a capacitance-voltage measurement (C-V measurement) and a Hall effect measurement. Further, a hole concentration can be estimated by identifying the structure of a semiconductor device according to various evaluation methods such as a transmission electron microscope observation, an energy-dispersive X-ray spectroscopic analysis, an X-ray diffraction measurement, and secondary ion mass spectroscopy, and performing device simulation based on the evaluation result.

If a breakdown current concentrates locally in the device, the device is destroyed from the concentrated location. Hence, in order to let as large a breakdown current as possible flow without destroying the device, it is preferable that the breakdown current flow uniformly throughout the device.

The principle by which a breakdown current that is uniform in a semiconductor device can be obtained by the present invention will be explained below. There exists Vpt variation in a device due to a structural variation. A punch-through breakdown starts from a location at which the Vpt is the minimum in the device. However, in a punch-through breakdown in the wide band gap semiconductor device according to the present invention, a breakdown current is suppressed at the location at which the breakdown has started, owing to the effects described below. Therefore, an effect of uniformalizing the distribution of the breakdown current can be obtained automatically.

A first effect is that a punch-through breakdown involves no such generation of electrons and holes as in an avalanche breakdown. Therefore, there is no need of eliminating holes. This allows the breakdown current to flow more uniformly, compared with a breakdown current in an avalanche breakdown.

A second effect is that mobility decrease due to temperature rise brings about suppression of the breakdown state. In a punch-through breakdown, a behavior as a unipolar device is maintained even though the device is in the breakdown state. Therefore, the carrier mobility is decreased upon temperature rise due to heat generation, as is so during an On state of the unipolar device. This brings about an effect of suppressing concentration of the breakdown current and automatically uniformalizing the distribution of the breakdown current.

A third effect is that the breakdown state of a punch-through breakdown is suppressed by the negative charges of the electrons caused to flow by the breakdown. This will be explained with reference to FIG. 4. Electrons having the same polarity as that of the negative charges of ionized acceptors in the P-type barrier region 102 flow therethrough. As a result, electrons become existent in the depletion layer. This is effectively equal to a state obtained by increasing the acceptor concentration in the P-type barrier region 102. This brings about an effect of suppressing concentration of the breakdown current and automatically uniformalizing the distribution of the breakdown current.

A fourth effect is that a current flow at the location of breakdown raises the temperature at the location, which increases the acceptor activation rate and suppresses the breakdown current. This will be explained with reference to FIG. 4. The hole activation rate in the P-type barrier region 102 is increased, arousing a state that is effectively equal to a state obtained by increasing the acceptor concentration in the P-type barrier region 102, which raises Vpt at the location of the breakdown. This brings about an effect of suppressing concentration of the breakdown current and automatically uniformalizing the distribution of the breakdown current.

By the synergy of the four effects described above, the wide band gap semiconductor device of the present invention can obtain a breakdown that is more uniform throughout the device than a breakdown obtained in a conventional device in which an avalanche breakdown occurs.

Further, a breakdown current according to the present invention flows from the drain electrode 112 toward the substrate (in the c-axis direction) along the breakdown current path 120. From this fact, the following two advantages can be obtained.

As a first advantage, a breakdown current flows inward in the device, which makes it possible to prevent the device from being destroyed near the surface. As a result, the device reliability is improved. As a second advantage, the dielectric constant in the c-axis direction is higher than the dielectric constant in the a-axis direction. Therefore, the trade-off among a punch-through breakdown voltage, an avalanche breakdown voltage, and a characteristic On resistance can be resolved, and a high device withstand voltage and a low On resistance can be achieved simultaneously within a small chip area.

The structure of the nitride semiconductor device according to the present invention shown in FIG. 4 may be modified within the spirit of the present invention. Specific modified examples will be described below.

Although not shown in FIG. 4, various semiconductors, insulators, and metals may be inserted between the substrate 100 and the N-type carrier supply region 101, without departing from the scope of the spirit of the present invention. Particularly, it is possible to incorporate an initial growth layer in order to improve the crystallinity of the nitride semiconductor. Specific examples include a low-temperature GaN buffer layer, a low-temperature AlGaN buffer layer, a low-temperature AlN buffer layer, and various insulators for lateral growth, which are used commonly.

Although not shown in FIG. 4, it is preferable that the surface of the device be covered with an insulation protection film. Examples of the insulation film include $SiO_2$, $SiN_x$, $Al_2O_3$, AlN, and diamond.

Although not shown in FIG. 4, it is possible to insert a spacer layer between the surface barrier layer 134 and the low-concentration withstand voltage control region 104. By inserting a spacer layer, it is possible to improve the mobility and to thereby lower the On resistance. A spacer layer is a nitride semiconductor, and has a band gap energy higher than that of the surface barrier layer 134. A preferable example thereof is an AlN layer having a thickness of 3 nm or less.

Although not shown in FIG. 4, it is possible to insert a well layer between the surface barrier layer 134 and the low-concentration withstand voltage control region 104 for promoting carrier trapping. This makes it possible to suppress a leakage current during an Off state. A well layer is a nitride semiconductor, and has a band gap energy lower than that of the low-concentration withstand voltage control region 104. A preferable example thereof is an InGaN layer having a thickness of 500 nm or less. A more preferable example thereof is an InGaN layer having a thickness of 50 nm or less.

Figure 9:
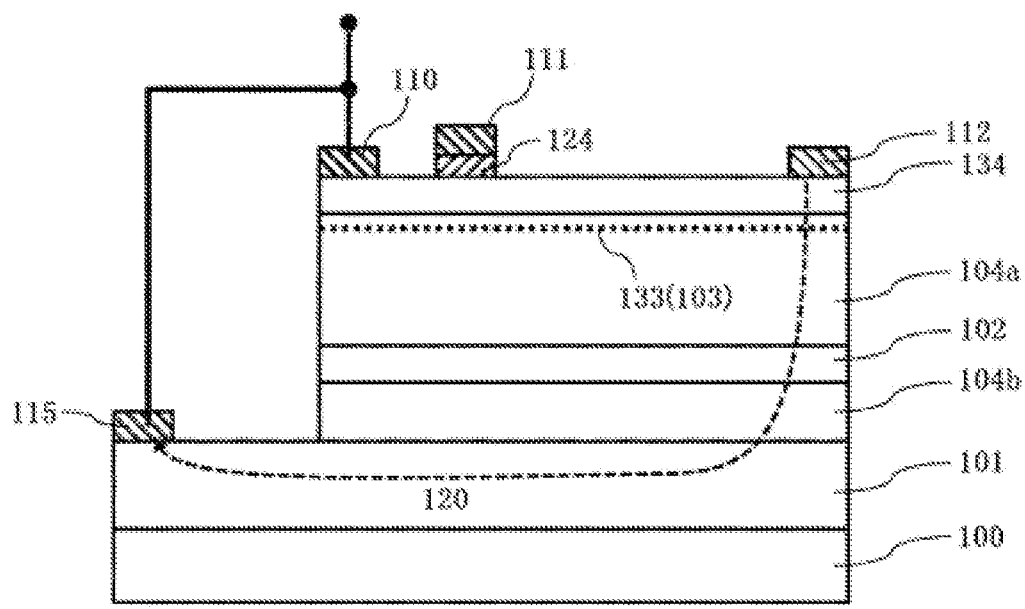
FIG. 9 is a cross-sectional configuration diagram of a modified example of the first embodiment.

Further, a modified example shown in FIG. 9 is available. A low-concentration withstand voltage control region 104b is added between the P-type barrier region 102 and the N-type carrier supply region 101. With the addition of the low-temperature withstand voltage control region 104b, withstanding against a reverse-direction voltage (a negative Vds) is improved. The low-concentration withstand voltage control region 104b is made of a low-concentration P-type, a low-concentration N-type, and a semi-insulating nitride semiconductor. A preferable example is AlGaN, InGaN, or GaN. However, it may be a multilayer film formed of two or more nitride semiconductor layers having different compositions. In order to suppress the carrier concentration, it is preferable that it be produced without doping. However, it is possible to add a Si donor or a Mg acceptor at a low concentration. Further, in order to impart a high resistivity, it is possible to add an impurity such as O and C that forms a deep level. The carrier concentration is preferably $1 \times 10^{16}$ $cm^{-3}$ or lower, and more preferably $5 \times 10^{15}$ $cm^{-3}$ or lower. It is preferable that the film thickness of the low-concentration withstand voltage control region 104b be smaller than that of the low-concentration withstand voltage control region 104a. The film thickness thereof is preferably equal to or less than ½, and more preferably equal to or less than ⅕ of the film thickness of the low-concentration withstand voltage control region 104a.

Figure 10:
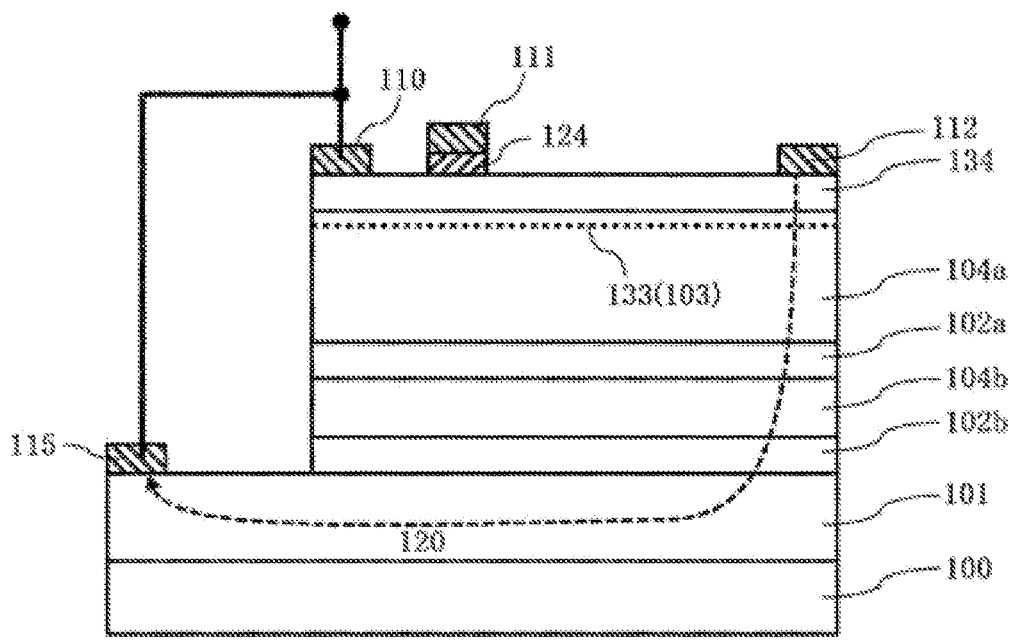
FIG. 10 is a cross-sectional configuration diagram of a modified example of the first embodiment.

Further, a modified example shown in FIG. 10 is available. Two or more P-type barrier regions 102 (102a and 102b in FIG. 10) and low-concentration withstand voltage control regions 104 (104a and 104b in FIG. 10) may be inserted between the N-type carrier supply region 101 and the N-type conductive region 103. This makes it possible to suppress breakdown voltage variation due to temperature variation.

Figure 11:
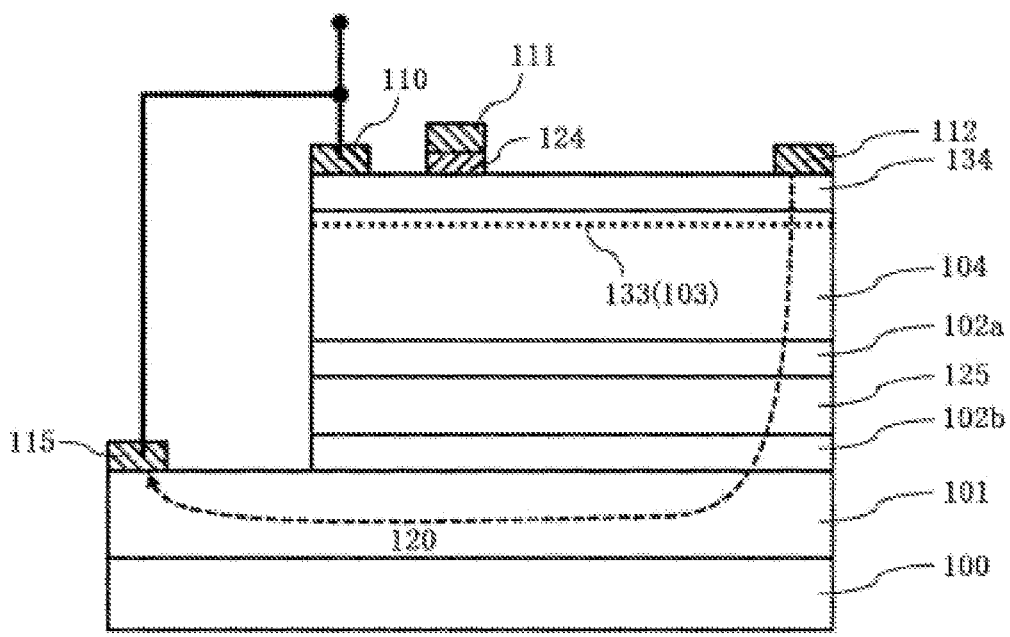
FIG. 11 is a cross-sectional configuration diagram of a modified example of the first embodiment.

Further, a modified example shown in FIG. 11 is available. An N-type intermediate layer 125 may be inserted between a plurality of P-type barrier regions 102 (102a and 102b). In this case, the sheet hole concentration in each P-type barrier region is determined to $1.7 \times 10^{13}$ $cm^{-2}$ or lower. This makes it possible to raise Vpt.

Figure 12:
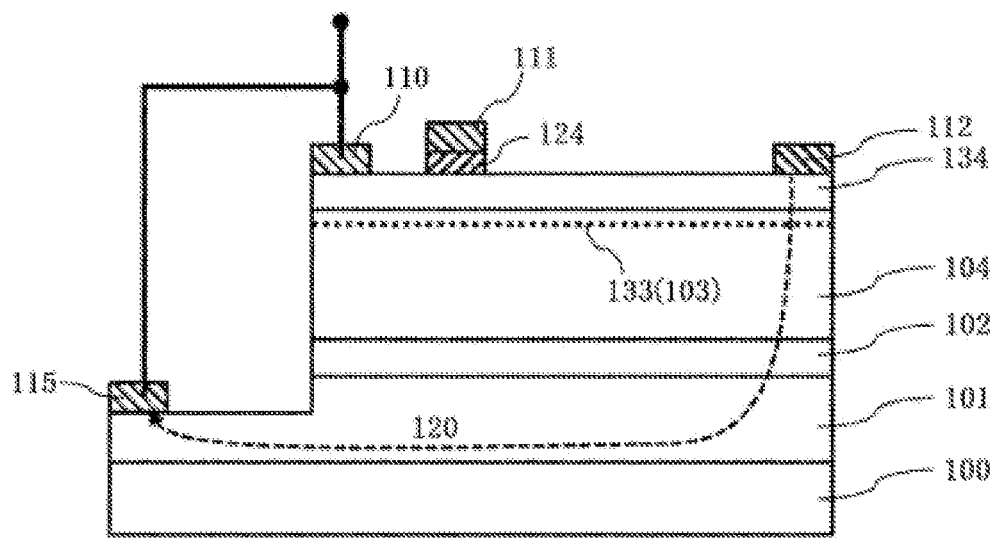
FIG. 12 is a cross-sectional configuration diagram of a modified example of the first embodiment.

Further, a modified example shown in FIG. 12 is available. This improves the yield in the semiconductor device production process, leading to reduction of the production costs.

Figure 13:
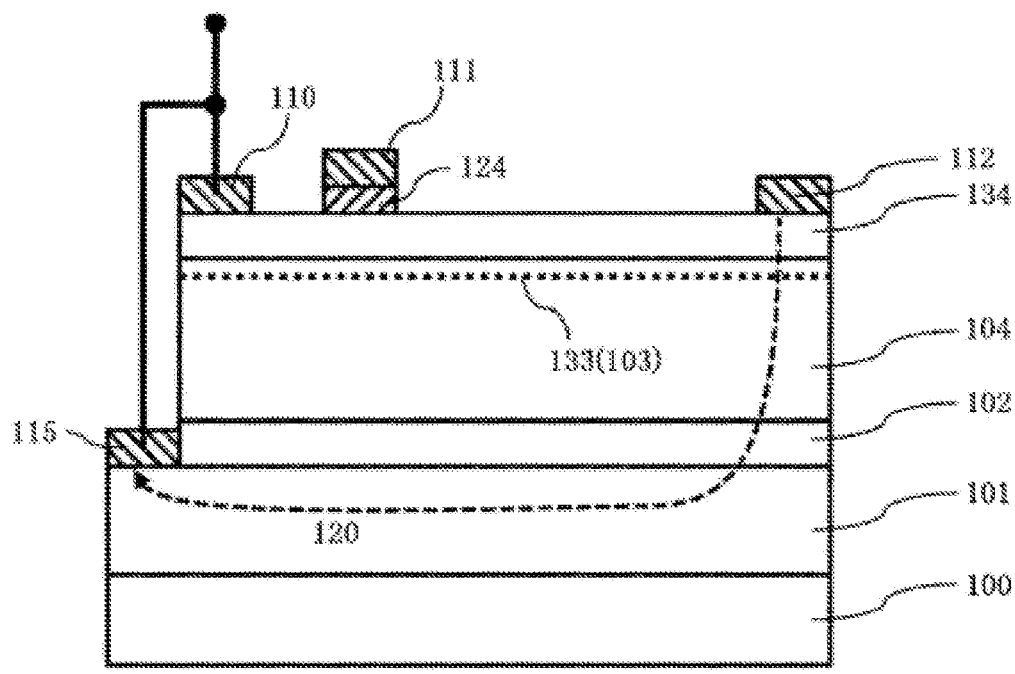
FIG. 13 is a cross-sectional configuration diagram of a modified example of the first embodiment.

Further, a modified example shown in FIG. 13 is available. The punch-through electrode 115 may contact the P-type barrier region 102. This allows reduction of the production costs.

Figure 14:
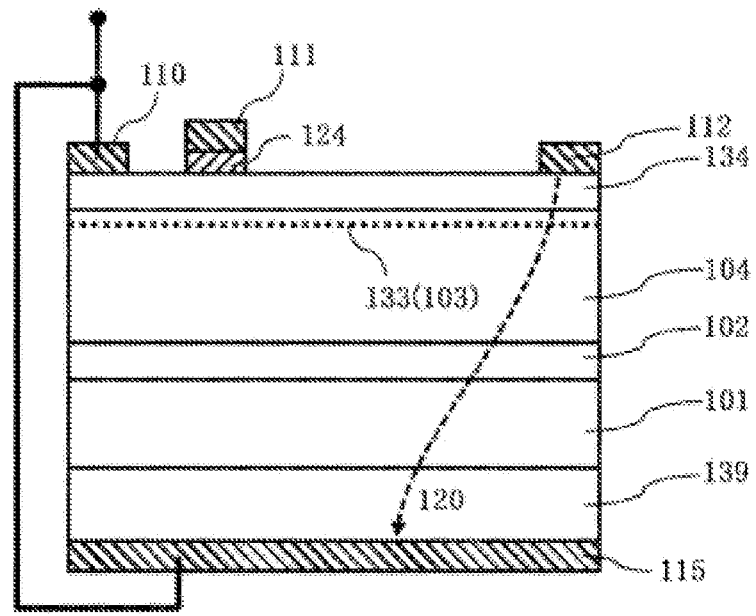
FIG. 14 is a cross-sectional configuration diagram of a modified example of the first embodiment.

Further, a modified example shown in FIG. 14 is available. By using an N-type nitride semiconductor substrate 139 as the substrate, it is possible to form the punch-through electrode 115 from the back side of the device. It is preferable that the N-type nitride semiconductor substrate 139 be GaN or AlN. This allows the substrate having a high volume to absorb an energy that may generate a surge voltage, which improves tolerance against breakdown. As a modified example of FIG. 14, the N-type nitride semiconductor substrate 139 may be replaced with an N-type semiconductor substrate other than a nitride semiconductor. Specifically, it is possible to use an N-type Si substrate and N-type SiC substrate. However, use of a substrate other than a nitride semiconductor will result in occurrence of a band offset in the conduction band at the interface between the N-type carrier supply region 101 and the N-type semiconductor substrate. Therefore, in order to let a sufficient breakdown current flow, it is preferable that the N-type semiconductor substrate be a high-concentration N-type. Specifically, it is preferable to use an N-type Si substrate having an electron concentration of $5\times10^{18}$ cm$^{-3}$ or higher, or an N-type SiC substrate having an electron concentration of $1\times10^{18}$ cm$^{-3}$ or higher.

Figure 15:
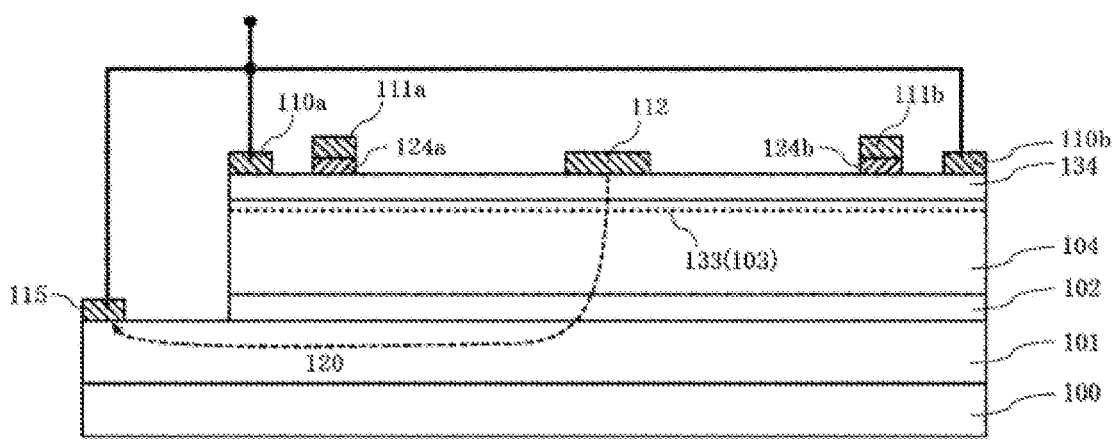
FIG. 15 is a cross-sectional configuration diagram of a modified example of the first embodiment.

Further, a modified example shown in FIG. 15 is available. A punch-through electrode 115 needs not be formed in every unit cell individually, but there may be one punch-through electrode 115 in common for a plurality of unit cells. This makes it possible to downsize the device area and reduce the production costs. Note that the reference signs 110a and 110b denote source electrodes, the reference signs 111a and 111b denote gate electrodes, and the reference signs 124a and 124b denote gate insulation films.

Figure 16:
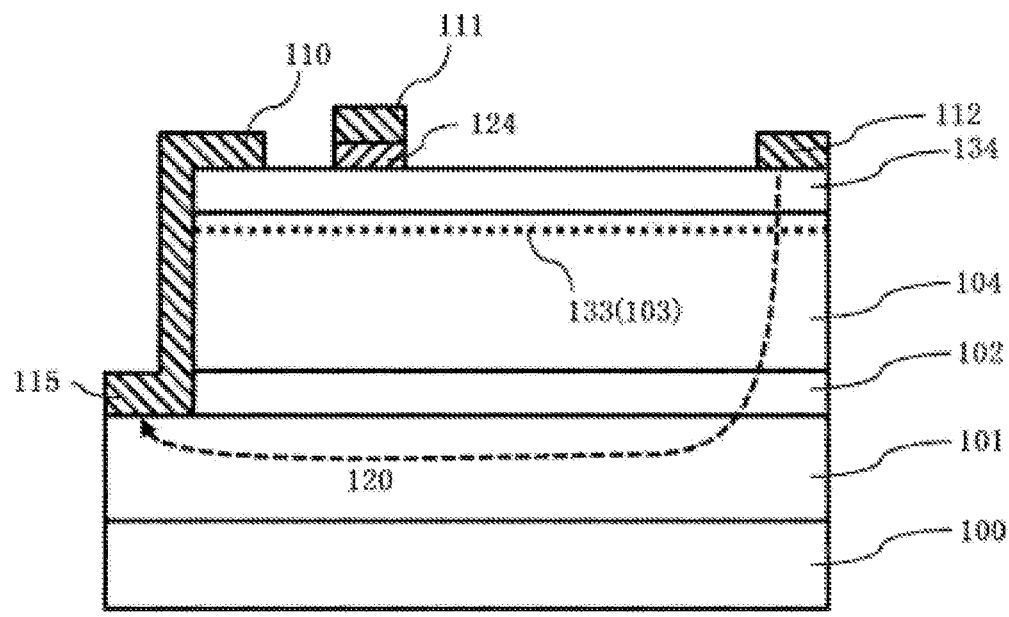
FIG. 16 is a cross-sectional configuration diagram of a modified example of the first embodiment.

Further, as shown in FIG. 16, the punch-through electrode 115 and the source electrode 110 may be formed integrally. This makes it possible to cause a breakdown that is uniform throughout the device. This also makes it possible to downsize the device area.

Figure 17:
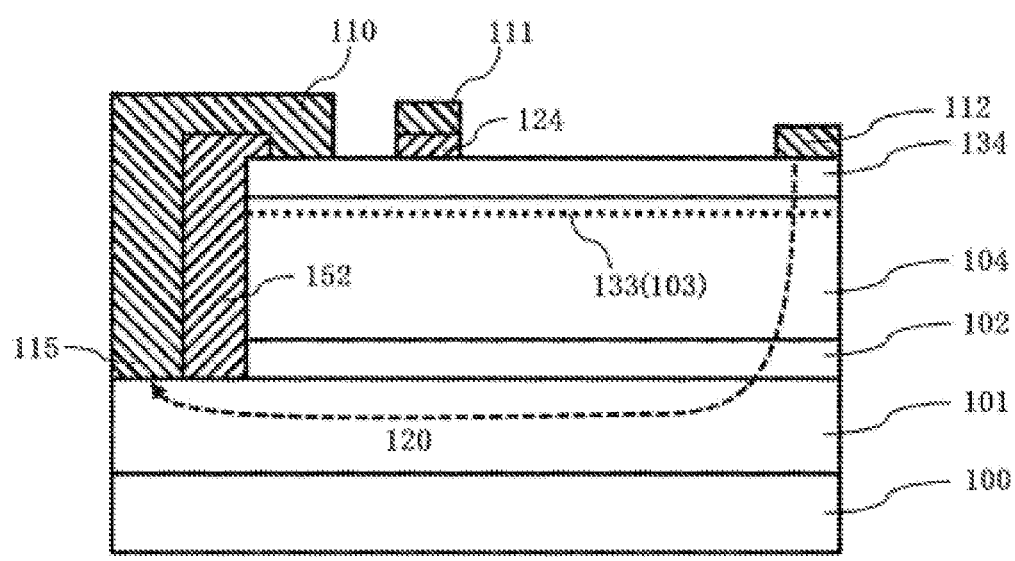
FIG. 17 is a cross-sectional configuration diagram of a modified example of the first embodiment.

Further, as shown in FIG. 17, a punch-through electrode insulation film 152 may be formed. With this, the punch-through electrode 115 is electrically insulated from the P-type barrier region 102 and the low-concentration withstand voltage control region 104, which makes it possible to suppress a leakage current that flows through the drain electrode 112 at equal to or lower than the breakdown voltage.

Figure 18:
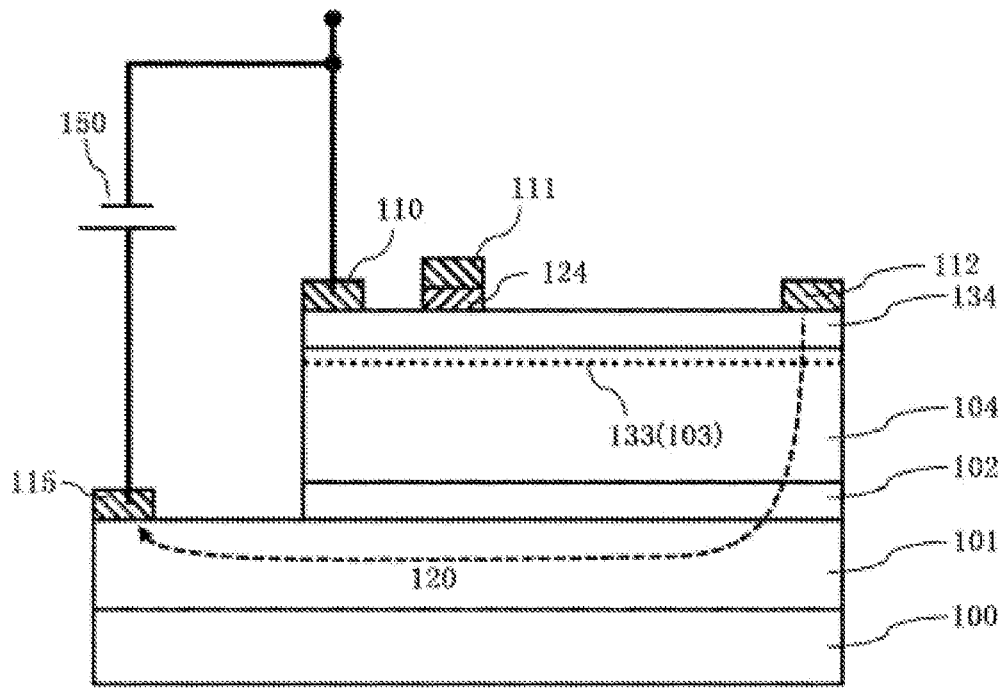
FIG. 18 is a cross-sectional configuration diagram of a modified example of the first embodiment.

Further, as shown in FIG. 18, the punch-through electrode 115 and the source electrode 110 may be electrically connected with each other via a punch-through control power supply 150, instead of being short-circuited with each other. This allows the punch-through control power supply 150 to control the punch-through voltage.

Figure 19:
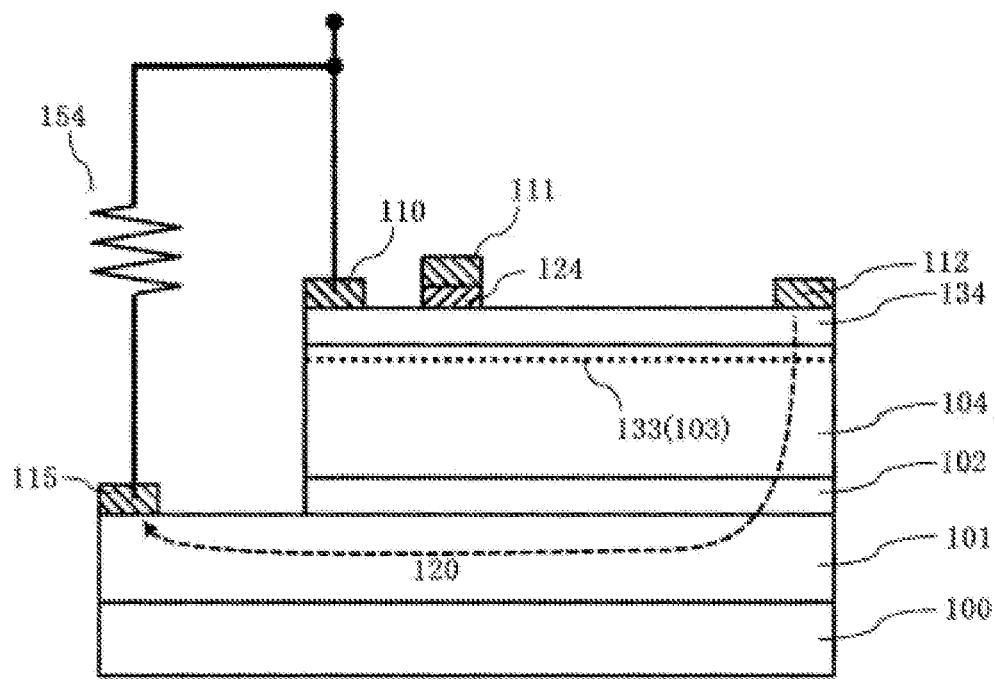
FIG. 19 is a cross-sectional configuration diagram of a modified example of the first embodiment.

Further, as shown in FIG. 19, the punch-through electrode 115 and the source electrode 110 may be electrically connected with each other via a resistor 154, instead of being short-circuited with each other. This makes it possible to let a breakdown current flow uniformly throughout the device, and to thereby improve tolerance against breakdown. Examples of the resistor 154 include a metal object, a resistor utilizing a drift resistance of a semiconductor, and a resistor utilizing a contact resistance between a metal and a semiconductor. The resistor can be formed together with the semiconductor device on one chip. Alternatively, the resistor 154 may be formed outside the semiconductor device.

Figure 20:
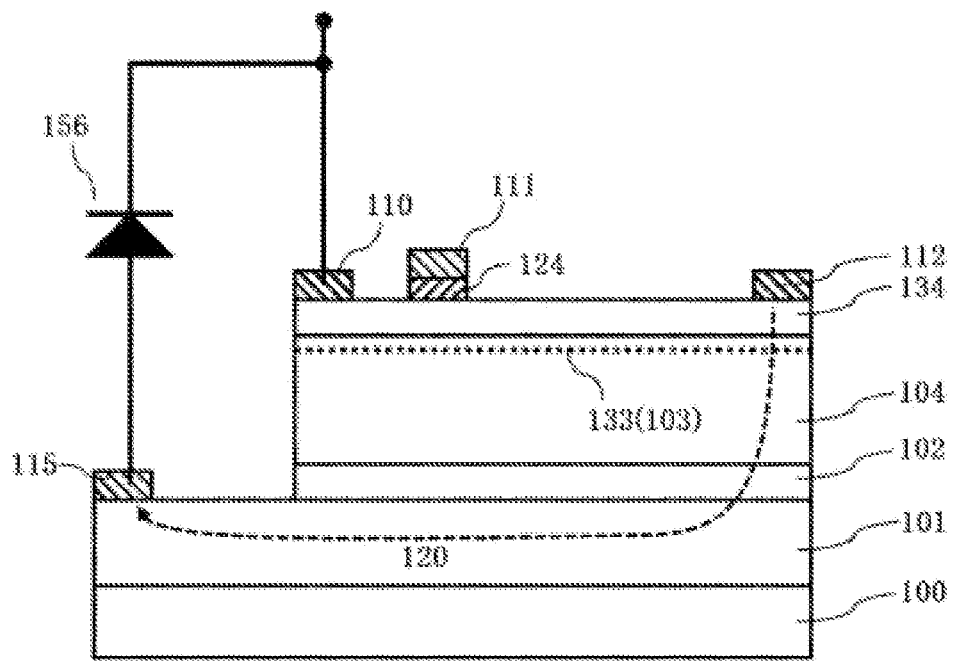
FIG. 20 is a cross-sectional configuration diagram of a modified example of the first embodiment.

Further, as shown in FIG. 20, the punch-through electrode 115 and the source electrode 110 may be electrically connected with each other via a diode 156, instead of being short-circuited with each other. This makes the diode 156 reversely biased upon a reverse-direction voltage (a negative Vds), which raises an avalanche breakdown voltage in the reverse voltage direction to thereby make it possible to prevent device destruction. As will be described in detail in the fifth embodiment, the diode 156 can be formed on one chip together with a diode formed on the same substrate. Alternatively, the diode 156 may be formed outside the semiconductor device.

Figure 21:
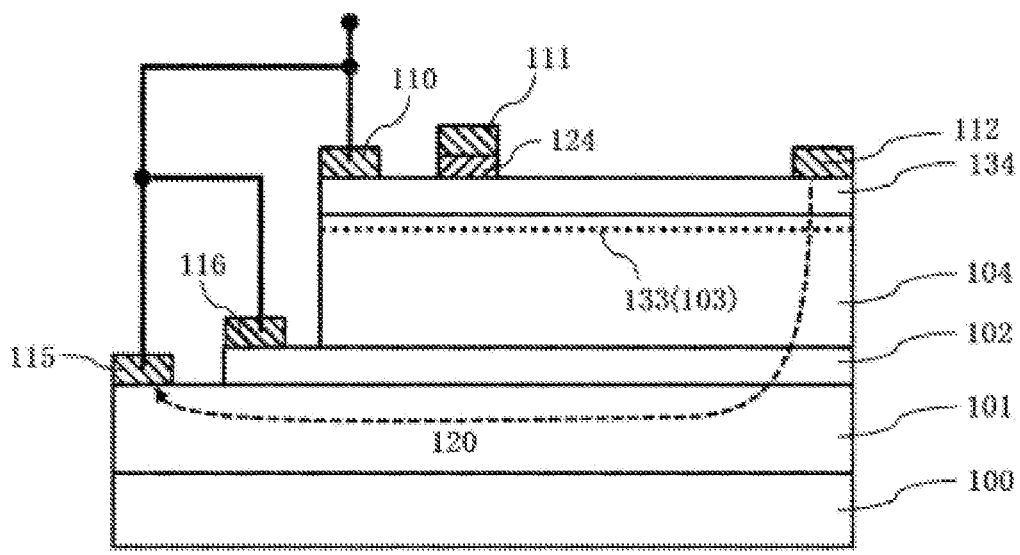
FIG. 21 is a cross-sectional configuration diagram of a modified example of the first embodiment.

Further, as shown in FIG. 21, a punch-through auxiliary electrode 116 having an ohmic contact with the P-type barrier layer 102 may be formed. This makes it possible to suppress the On resistance of the device in switching. In this case, in a punch-through breakdown state, a current flows from the drain electrode 112 toward the punch-through electrode 115, whereas substantially no current flows between the drain electrode 112 and the punch-through auxiliary electrode 116. Specifically, a current that may flow between the drain electrode 112 and the punch-through auxiliary electrode 116 is equal to or less than $\frac{1}{1,000}$, and more preferably equal to or less than $\frac{1}{10,000}$ of the current that flows from the drain electrode 112 toward the punch-through electrode 115. Hence, even when the punch-through auxiliary electrode 116 is formed, a behavior as a unipolar device in a breakdown state is maintained, and a uniform breakdown current distribution can be obtained. It is preferable that the punch-through auxiliary electrode 116 be electrically short-circuited with the punch-through electrode 115 as shown in FIG. 21.

Figure 22:
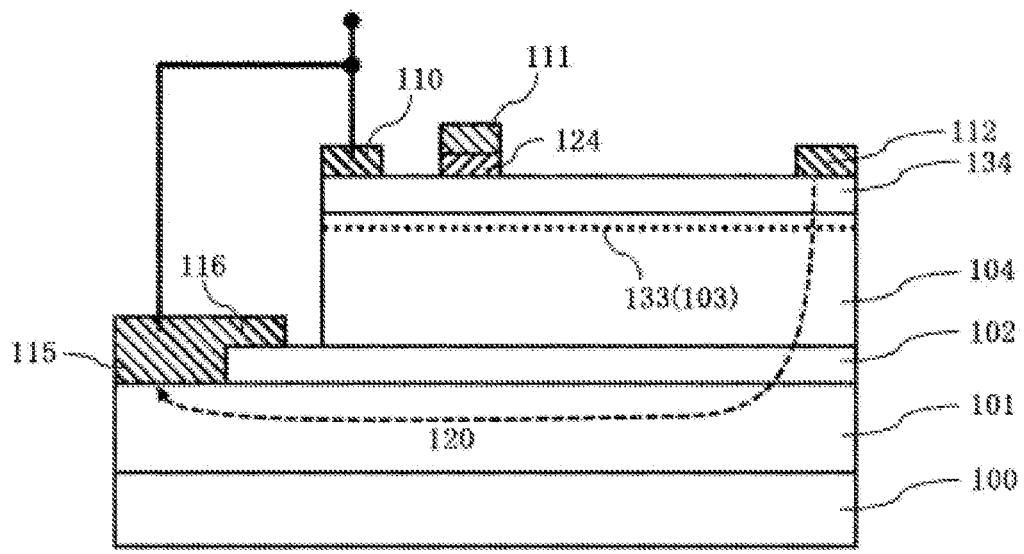
FIG. 22 is a cross-sectional configuration diagram of a modified example of the first embodiment.

Further, as shown in FIG. 22, the punch-through auxiliary electrode 116 may be short-circuited with the punch-through electrode 115, by being formed integrally therewith. This makes it possible to downsize the device area and reduce the production costs.

Figure 23:
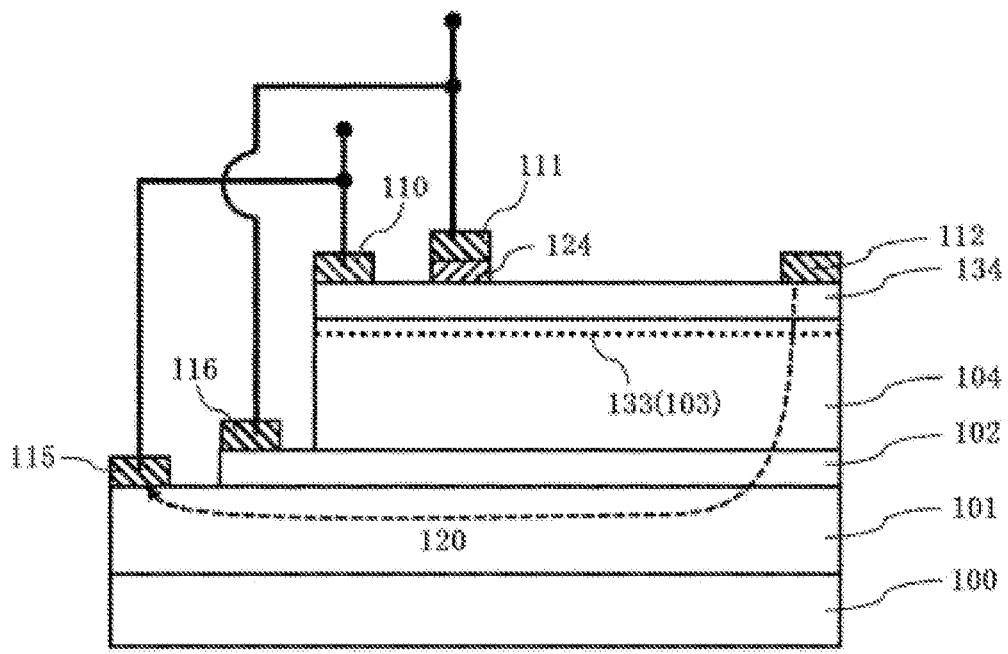
FIG. 23 is a cross-sectional configuration diagram of a modified example of the first embodiment.

Further, as shown in FIG. 23, the punch-through auxiliary electrode 116 may be electrically short-circuited with the gate electrode 111. This makes it possible to suppress a leakage current during an Off state. Further, it is possible to improve the uniformity of a breakdown current in the device, by connecting the punch-through auxiliary electrode 116 and the gate electrode 111 with each other through a resistor, although not shown in FIG. 23.

Figure 24:
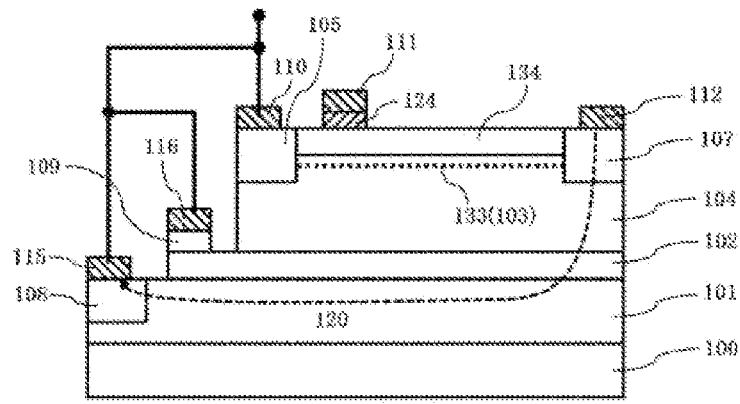
FIG. 24 is a cross-sectional configuration diagram of a modified example of the first embodiment.

Further, a modified example shown in FIG. 24 is available. The punch-through electrode 115 may be connected indirectly with the N-type carrier supply region 101 via an N-type contact region 108. The punch-through auxiliary electrode 116 may be connected indirectly with the P-type barrier region 102 via a P-type contact region 109. The source electrode 110 may be connected indirectly with the N-type conductive region 103 via an N-type contact region 105. The drain electrode 112 may be connected indirectly with the N-type conductive region 103 via an N-type contact region 107. This makes it possible to suppress the contact resistance and perform a high-speed switching operation.

Figure 25:
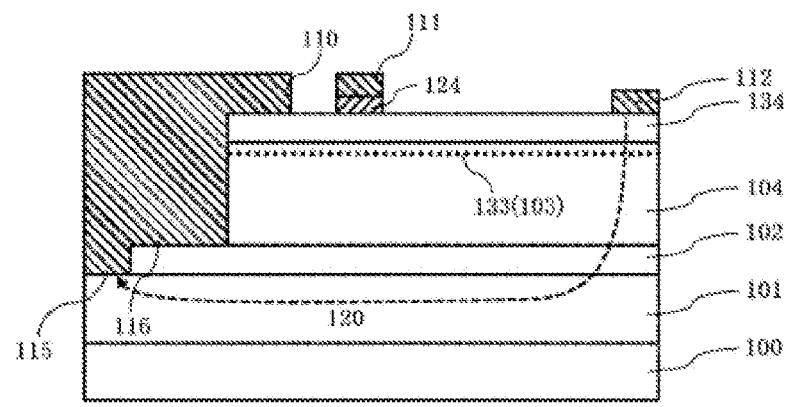
FIG. 25 is a cross-sectional configuration diagram of a modified example of the first embodiment.

Further, as shown in FIG. 25, the punch-through electrode 115, the punch-through auxiliary electrode 116, and the source electrode 110 may be formed integrally. This makes it possible to downsize the device area and suppress the production costs.

Figure 26:
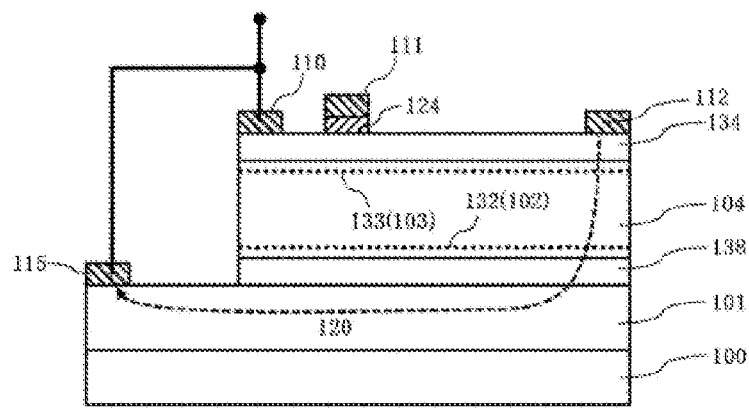
FIG. 26 is a cross-sectional configuration diagram of a modified example of the first embodiment.

Further, a modified example shown in FIG. 26 is available. A polarization layer 138 having a composition different from that of the low-concentration withstand voltage control region 104 generates negative polarization at the heterojunction interface between the low-concentration withstand voltage control region 104 and the polarization layer 138, to thereby induce a two-dimensional hole gas 132 that forms the P-type barrier region 102. This makes it possible to form a P-type barrier region 102 including holes at a high concentration, which cannot be formed only by Mg doping. The concentration of holes generated by the polarization does not depend on the temperature. Hence, by utilizing polarization, it is possible to suppress punch-through breakdown voltage variation due to temperature variation significantly. It is possible to further increase the hole concentration by Mg doping near the heterojunction interface between the low-concentration withstand voltage control region 104 and the polarization layer 138. The Mg doping concentration can be reduced from when the P-type barrier region 102 is formed only by Mg doping. Therefore, punch-through breakdown voltage variation due to temperature variation can be suppressed significantly. In this case, the Mg concentration is preferably $2\times10^{19}$ cm$^{-3}$ or lower, and more preferably $5\times10^{18}$ cm$^{-3}$ or lower. A breakdown current in this modified example is characterized in that it flows along a path 120 that passes through a heterojunction interface having negatively polarized charges.

Here, a two-dimensional hole gas means holes that are induced by negatively polarized charges at a heterojunction interface and are distributed two-dimensionally at the heterojunction interface.

Figure 27:
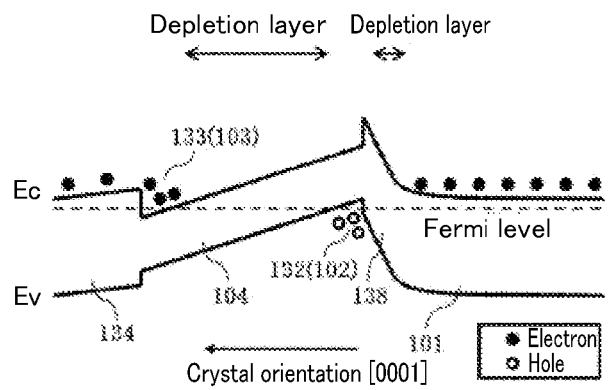
FIG. 27 is a schematic diagram of a band structure below a drain electrode of the modified example of FIG. 26 during zero bias.

FIG. 27 shows a schematic diagram of a profile of a band structure in FIG. 26 in a semiconductor region located below the drain electrode 112 in a direction perpendicular to the surface of the substrate. It is preferable that the polarization layer 138 be made of a nitride semiconductor that has a band gap energy higher than that of the low-concentration withstand voltage control region 104. This makes it possible to generate a two-dimensional hole gas 132 having a high concentration. Specifically, it is preferable that the polarization layer 138 be made of InAlGaN, AlGaN, GaN, InAlN, or InGaN that has a band gap energy higher than that of the low-concentration withstand voltage control region 104. The polarization layer may also be a multilayer film formed of two or more kinds of nitride semiconductor layers having different compositions.

Figure 28:
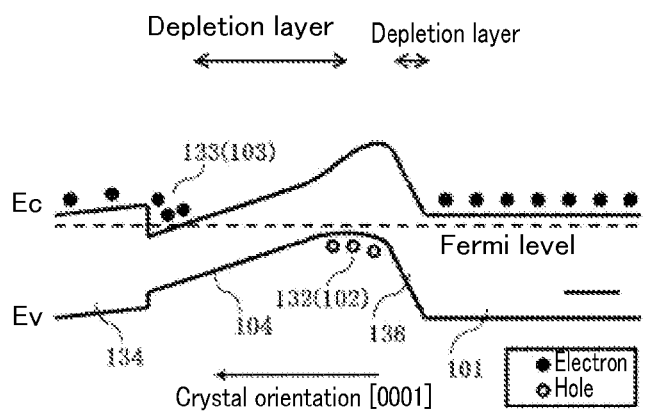
FIG. 28 is a schematic diagram of a modified example of the band structure below the drain electrode of the modified example of FIG. 26 during zero bias.

FIG. 28 shows a schematic diagram of a modified example of the band structure in FIG. 26. By varying the compositions between the polarization layer 138 and the low-concentration withstand voltage control region 104 continuously, it is possible to suppress the band discontinuity at the heterojunction between the polarization layer 138 and the withstand voltage control region 104. This makes it possible to let flow a punch-through breakdown current that is uniform throughout the device, leading to improvement of tolerance against breakdown.

Figure 29:
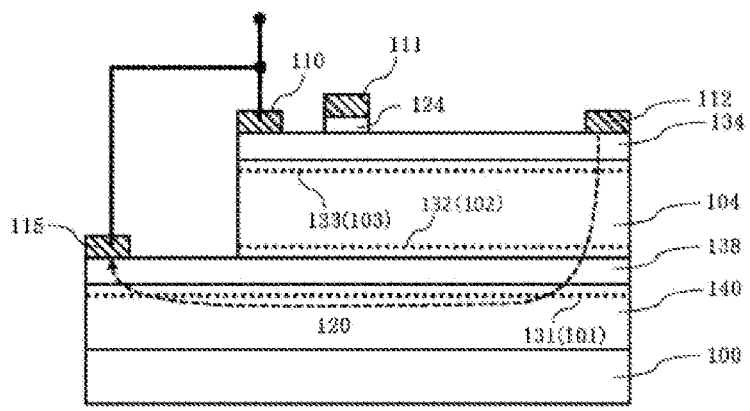
FIG. 29 is a cross-sectional configuration diagram of a modified example of the first embodiment.
Figure 30:
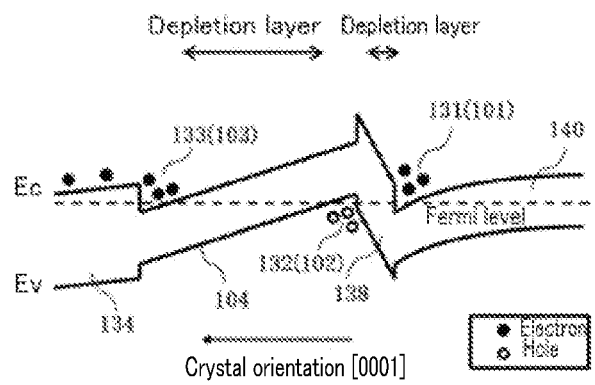
FIG. 30 is a schematic diagram of a band structure below a drain electrode of the modified example of FIG. 29 during zero bias.

Further, a modified example shown in FIG. 29 is available. A low-concentration region 140 having a composition different from that of a polarization layer 138 generates positive polarization at the heterojunction interface between the polarization layer 138 and the low-concentration region 140, and a two-dimensional electron gas 131 induced by the polarization forms the N-type carrier supply region 101. This makes it possible to form an N-type carrier supply region 101 including electrons at a high concentration, which cannot be formed only by Si doping. It is possible to further increase the electron concentration by Si doping near the heterojunction interface between the polarization layer 138 and the low-concentration region 140. This makes it possible to reduce the Si doping concentration, and thereby to suppress punch-through breakdown voltage variation due to temperature variation. In this case, the Si concentration is preferably $2\times10^{19}$ cm$^{-3}$ or lower, and more preferably $5\times10^{18}$ cm$^{-3}$ or lower. Furthermore, electrons generated by polarization have a high mobility. Hence, utilization of polarization makes it possible to let a breakdown current flow instantly upon a surge voltage, leading to improvement of the device tolerance against breakdown. Further, it is preferable that the polarization layer 138 be made of InAlGaN, AlGaN, or InAlN. Particularly, when InAlN is used, it is preferable that the In composition be 40% or lower, and it is more preferable that the In composition be in the range of from 13% to 25%.

Figure 39:
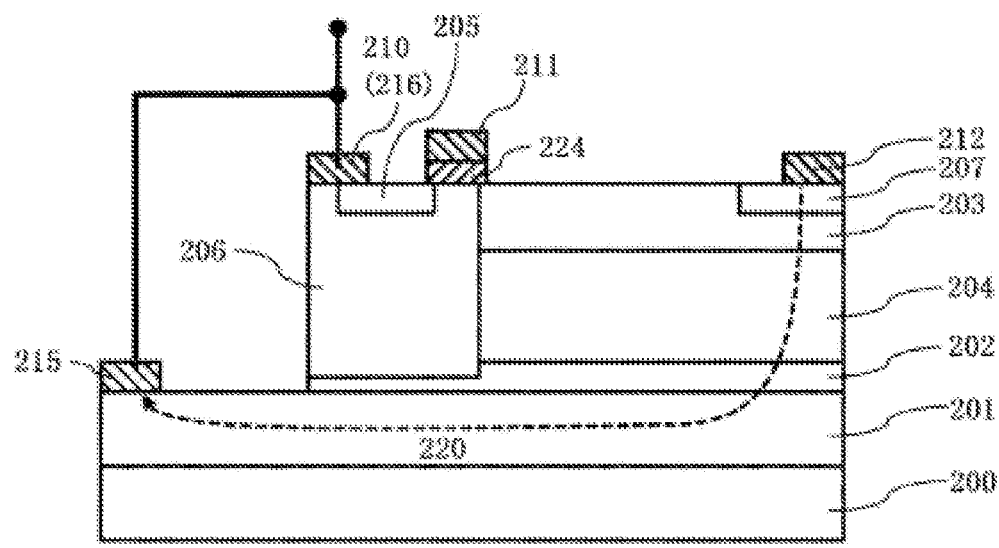
FIG. 39 is a cross-sectional configuration diagram of a modified example of the second embodiment.

FIG. 39 shows a schematic diagram of a profile of a band structure in FIG. 29 in a semiconductor region located below the drain electrode 112 in a direction perpendicular to the surface of the substrate. It is preferable that the low-concentration region 140 be made of a nitride semiconductor that has a band gap energy lower than that of the polarization layer 138. This makes it possible to generate a two-dimensional electron gas 131 having a high concentration. Specifically, it is preferable that the low-concentration layer 140 be made of InAlGaN, AlGaN, GaN, InAlN, or InGaN that has a band gap energy lower than that of the polarization layer 138. The low-concentration region may be a multilayer film formed of two or more kinds of nitride semiconductor layers having different compositions.

Figure 31:
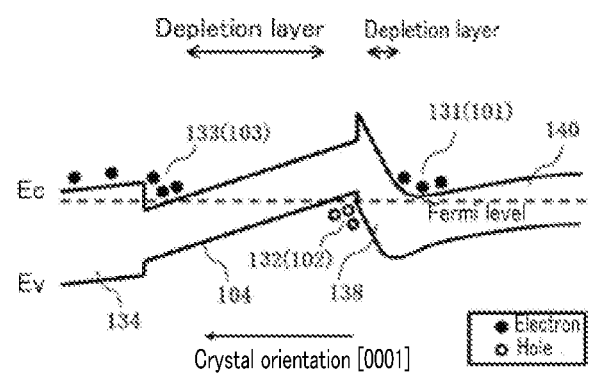
FIG. 31 is a schematic diagram of a modified example of the band structure below the drain electrode of the modified example of FIG. 29 during zero bias.

FIG. 31 shows a schematic diagram of a modified example of the band structure in FIG. 29. By varying the compositions between the polarization layer 138 and the low-concentration region 140 continuously, it is possible to suppress the band discontinuity at the heterojunction between the polarization layer 138 and the low-concentration region 140. This makes it possible to let flow a punch-through breakdown current that is uniform throughout the device, leading to improvement of tolerance against breakdown.

Figure 32:
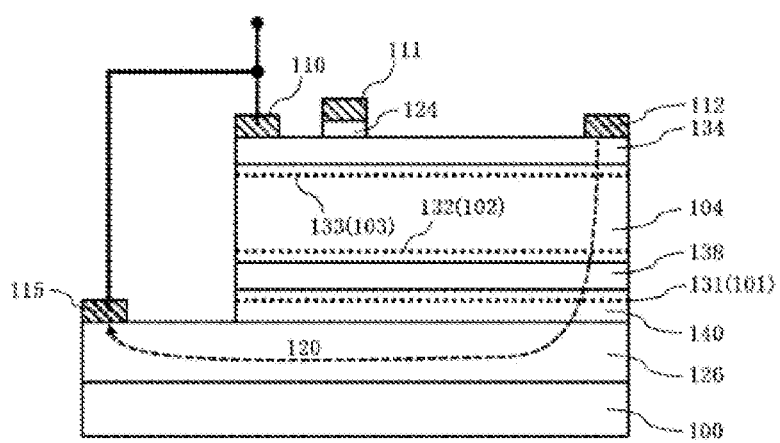
FIG. 32 is a cross-sectional configuration diagram of a modified example of the first embodiment.
Figure 33:
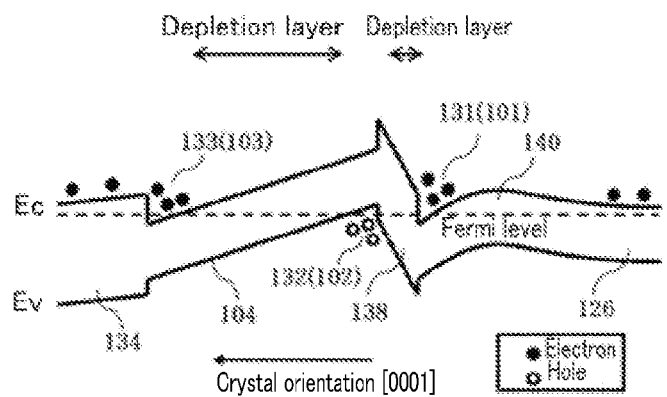
FIG. 33 is a schematic diagram of a band structure below a drain electrode of the modified example of FIG. 32 during zero bias.

Further, a modified example shown in FIG. 32 is available. An N-type foundation layer 126 is formed below the low-concentration region 140, and the punch-through electrode 115 is formed over the N-type foundation layer 126. This makes it possible to reduce the production costs of the device. FIG. 33 shows a schematic diagram of a profile of a band structure in FIG. 32 in a semiconductor region located below the drain electrode 112 in a direction perpendicular to the surface of the substrate.

Figure 34:
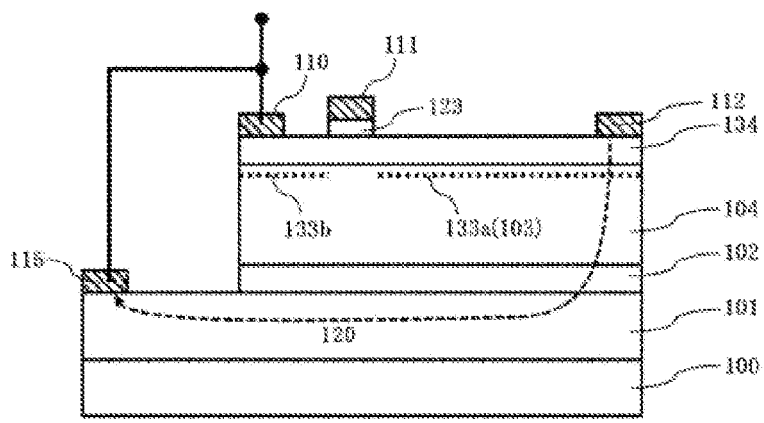
FIG. 34 is a cross-sectional configuration diagram of a modified example of the first embodiment.

Further, by providing a P-type gate region 123 between the gate electrode 111 and the surface barrier layer 134 as shown in FIG. 34, it is possible to prevent an avalanche breakdown in a normally-off-type HFET and improve its tolerance against breakdown. Note that the reference signs 133a and 133b denote two-dimensional electron gases.

Figure 35:
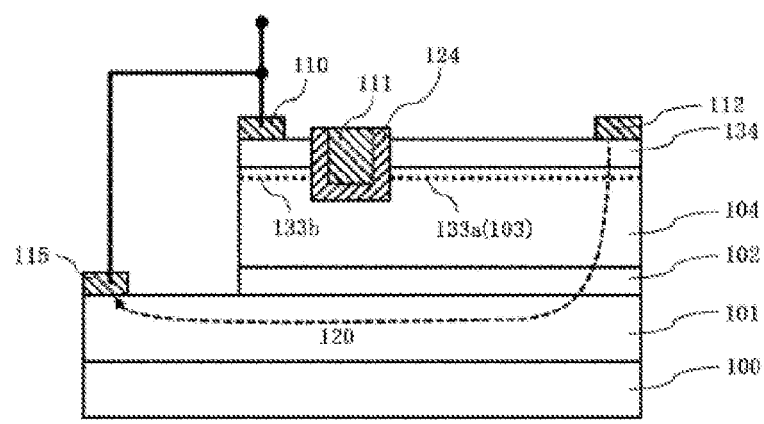
FIG. 35 is a cross-sectional configuration diagram of a modified example of the first embodiment.

Further, by forming a trench-gate structure as shown in FIG. 35, it is possible to prevent an avalanche breakdown in a normally-off-type HFET and improve its tolerance against breakdown.

Figure 36:
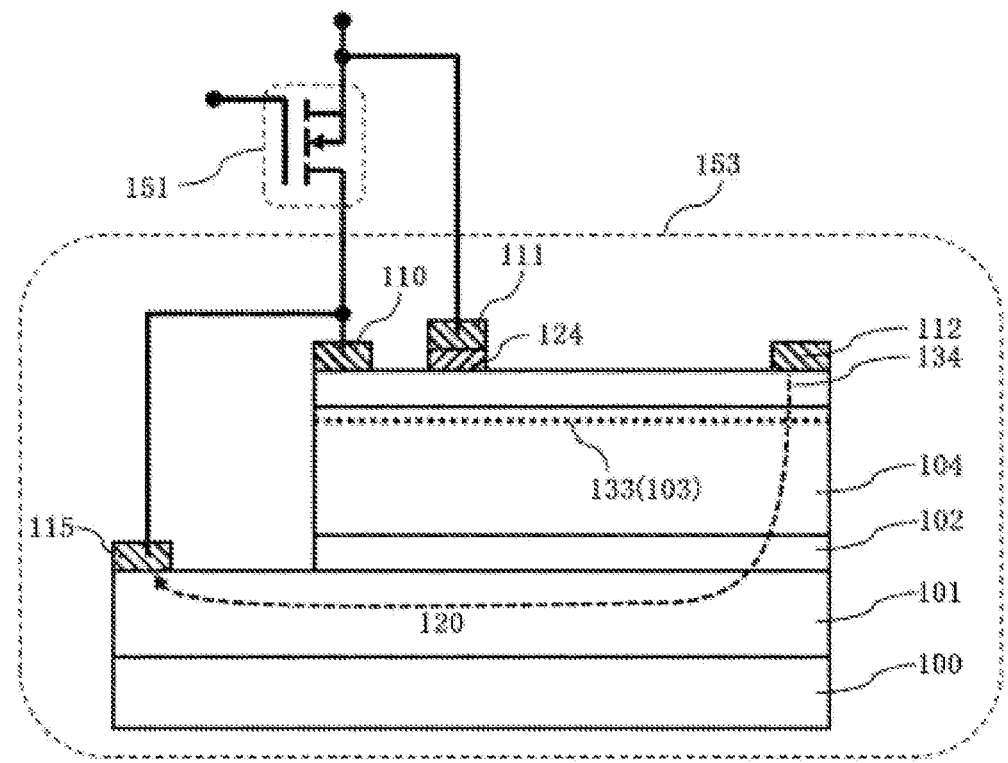
FIG. 36 is a cross-sectional configuration diagram of a modified example of the first embodiment.

Further, by cascoding a transistor 153 having the normally-on-type punch-through breakdown function of the present invention with a normally-off-type Si-MISFET 151 as shown in FIG. 36, it is possible to realize a normally-off-type transistor equivalently. In a breakdown state, an avalanche breakdown occurs in the Si-MISFET 151. A punch-through breakdown behavior occurs, but no avalanche breakdown occurs in the portion of the transistor 153 that has the punch-through breakdown function. The device withstand voltage of the transistor 153 having the punch-through breakdown function is higher than that of the normally-off-type Si-MISFET 151. Specifically, the device withstand voltage of the transistor 153 having the punch-through breakdown function is three or more times, and more preferably six or more times as high as that of the Si-MISFET 151. This suppresses the energy to be consumed by the Si-MISFET 151 in which an avalanche breakdown occurs upon a breakdown. The transistor having the punch-through breakdown function, which consumes a high energy upon a breakdown, has a high tolerance against a punch-through breakdown. Hence, the device of FIG. 36 as a whole can have a high tolerance against breakdown. Further, the reliability of the gate insulation film of a Si-MISFET is by far higher than that the reliability of a gate structure of a wide band gap semiconductor. Therefore, the configuration of FIG. 36 makes it possible for the device as a whole to have a high reliability.

In FIG. 36, the punch-through electrode 115 is electrically short-circuited with the source electrode 110 and with a drain electrode of the Si-MISFET 151. However, it is possible to modify the punch-through electrode 115 so as to be electrically isolated from the source electrode 110 and from the drain electrode of the Si-MISFET 151, and so as to be electrically short-circuited with a source electrode of the Si-MISFET 151. Voltage stability in a breakdown state is improved with this modification. Further, the Si-MISFET 151 in FIG. 36 may be replaced with various field effect transistors and NPN bipolar transistors that are made of Si.

A cascoded circuit is a circuit in which a drain electrode of a first transistor is short-circuited with a source electrode of a second transistor, and a gate electrode of the second transistor is electrically connected with a source electrode of the first transistor. The electrical connection between the gate electrode of the second transistor and the source electrode of the first transistor is preferably by short-circuiting. However, they may be connected via a resistor, a voltage source, an inductor, and a capacitor, which makes it possible to stably control the voltage to drop across the first transistor during a breakdown, and to thereby improve the reliability of the device.

The first embodiment has presented an N-channel-type HFET. However, it is possible to apply the present invention to a P-channel-type HFET by interchanging N-type with P-type, a donor with an acceptor, positive polarization with negative polarization, and electrons with holes.

Further, the first embodiment has explained a HFET made of a nitride semiconductor. However, it is possible to apply the present invention to a HFET made of any other wide band gap semiconductor such as SiC, an oxide semiconductor, and diamond.

However, it is preferable that the path along which a breakdown current flows be made of one kind of wide band gap semiconductor. If it is made of two or more kinds of wind band gap semiconductors, flow of electrons and holes is hindered at the junction interface between them, which makes it difficult to let occur a punch-through breakdown that is uniform throughout the device. Specifically, it is preferable that the surface barrier layer 134, the low-concentration withstand voltage control region 104, the P-type barrier region 102, and the N-type carrier supply region 101, which fall on the breakdown current path 120 in FIG. 4, be made of the same kind of wide band gap semiconductor.

Here, wide band gap semiconductors are assumed to be of the same kind, when they include the same period 2 element of the periodic table as a main component to constitute the crystal of the wide band gap semiconductors.

Furthermore, in order to let a uniform punch-through breakdown occur, it is preferable that the band offset at the heterojunction interfaces be small in the breakdown current path 120. Specifically, in such an N-channel-type device as in FIG. 4, a conduction band offset is preferably 0.5 eV or less, and more preferably 0.1 eV or less. In a P-channel-type device, a valence band offset is preferably 0.5 eV or less, and more preferably 0.1 eV or less.

The modified examples of the nitride semiconductor device according to the first embodiment described above may be used in combination. They may be modified appropriately within the spirit of the present invention.

Example 2

Figure 37:
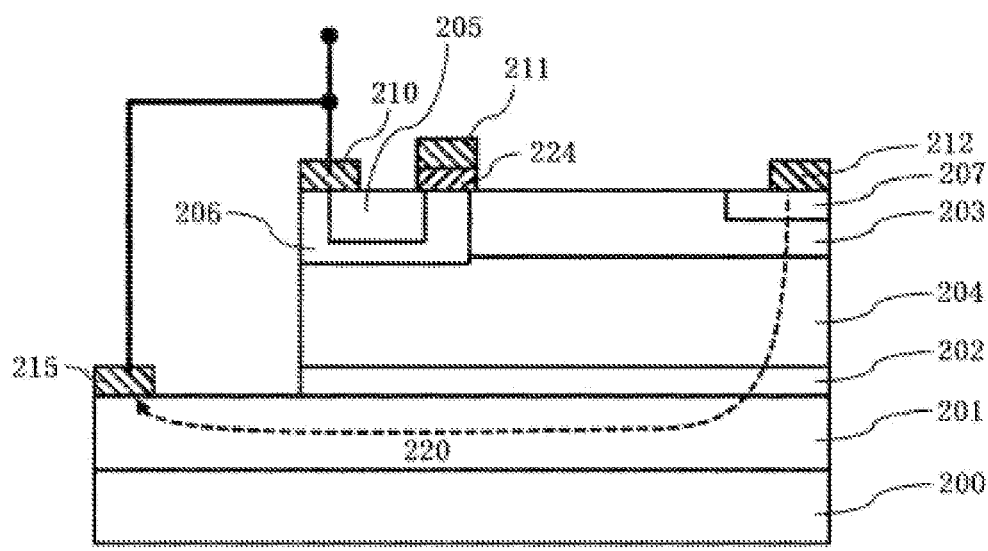
FIG. 37 is a cross-sectional configuration diagram of a SiC-MISFET according to a second embodiment.

In the second embodiment of the present invention, a MISFET made of SiC, which is the second embodiment, will be explained. FIG. 37 shows a structure diagram of a MISFET made of SiC according to the present invention. The semiconductor material forming the MISFET is SiC, except for a substrate 200. It is preferable that the polytype of SiC be 3C, 6H, and 4H. The substrate 200 may be made of a material other than SiC.

Further, a polytype is particularly preferably 6H and 4H of a hexagonal crystal system, and it is preferable that the layer structure be formed in a c-axis direction of a hexagonal crystal structure. The c-axis direction is a [0001] or [000–1] direction. A dielectric constant in the c-axis direction is higher than the dielectric constant in the a-axis direction. Therefore, the trade-off among a punch-through breakdown voltage, an avalanche breakdown voltage, and a characteristic On resistance can be resolved, and a high device withstand voltage and an On resistance can be achieved simultaneously within a small chip area.

It is preferable that the material of the substrate 200 be a material over which a high-quality SiC crystal growth can be realized. It is particularly preferable that the material be the same polytype as a growth layer formed over the material itself, and be a c-plane SiC substrate. Other examples of the material include a Si substrate, a SOI (Silicon-on-Insulator) substrate, a SOS (Silicon-on-Sapphire) substrate, a sapphire substrate, a SiC substrate, a diamond substrate, and a nitride semiconductor substrate. A preferable plain orientation of the substrate is a (0001) plane or a (000–1) plane of a hexagonal crystal system, and a (111) plane of a cubic crystal system. With this feature, it is possible to form the layer structure shown in FIG. 37 in the c-axis direction.

An N-type carrier supply region 201 is formed over the substrate 200. The N-type carrier supply region 201 is made of SiC having an N-type conductivity. In order to impart the N-type conductivity, it is preferable to dope the region with a donor impurity, and it is more preferable to dope the region with N (nitrogen). The N doping concentration is preferably $5\times10^{16}$ cm$^{-3}$ or higher, and more preferably $3\times10^{17}$ cm$^{-3}$. However, depending on the growth conditions, it is possible to obtain an N-type SiC without doping. Therefore, it is possible to produce the N-type carrier supply region 201 without doping.

A P-type barrier region 202 is formed over the N-type carrier supply region 201. In order to impart the P-type conductivity, it is preferable to dope the region with an acceptor impurity, and it is more preferable to dope the region with Al. The Al doping concentration is preferably $1\times10^{16}$ cm$^{-3}$ or higher, and more preferably $3\times10^{16}$ cm$^{-3}$ or higher. When the Al concentration is increased, a hole activation rate at or about room temperature falls. Hence, due to heat generation at the location at which a breakdown occurs in the device, the hole activation rises, which automatically suppresses the punch-through breakdown. Therefore, the breakdown can occur uniformly throughout the device. However, an excessively high Al concentration leading to an activation rate fall accompanies an excessive punch-through breakdown voltage variation due to temperature variation. In the worst case, the punch-through breakdown voltage rises as the temperature rises and may reach an avalanche breakdown voltage. Therefore, the Al concentration is preferably $2\times10^{19}$ cm$^{-3}$ or lower, and more preferably $5\times10^{18}$ cm$^{-3}$ or lower.

A low-concentration withstand voltage control region 204 is formed over the P-type barrier region 202. The low-concentration withstand voltage control region 204 is made of a low-concentration P-type, a low-concentration N-type, and a semi-insulating SiC. In order to suppress the carrier concentration, it is preferable to produce this region without doping. However, it is possible to add an N donor or Al acceptor at a low concentration. Further, in order to impart a high resistivity, it is possible to add an impurity such as O and C that forms a deep level. The carrier concentration is preferably $1\times10^{16}$ cm$^{-3}$ or lower, and more preferably $5\times10^{15}$ cm$^{-3}$ or lower. The film thickness is an important parameter that determines the withstand voltage, and needs to be designed based on the withstand voltage. The film thickness is 0.7 μm or greater when the withstand voltage is 200 V or higher, and 2.1 μm or greater when the withstand voltage is 600 V or higher.

An N-type conductive region 203 is formed over the low-concentration withstand voltage control region 204. During an On state of the device, electrons, which are the carriers, flow from a source electrode 210 to a drain electrode 212 through the N-type conductive region 203. The sheet electron concentration in the N-type conductive region 203 at 300 K is $3\times10^{12}$ cm$^{-2}$ or higher, and more preferably $6\times10^{12}$ cm$^{-2}$ or higher. It is preferable that the sheet electron concentration in the N-type conductive region 203 be higher than the sheet hole concentration in the P-type barrier region 202. This makes it possible to let a punch-through breakdown occur stably. Here, the sheet electron concentration is a value obtained by integrating the electron concentration in the N-type conductive region 203 in a direction perpendicular to the surface of the substrate.

An N-type contact region 205 and a P-type contact region 206 are formed, so that a contact resistance of the source electrode 210 may be suppressed. Further, an N-type contact region 207 is formed, so that a contact resistance of the drain electrode 212 may be suppressed.

A punch-through electrode 215 forms an ohmic contact with the N-type carrier supply region 201 in terms of electron exchange.

The drain electrode 212 forms an ohmic contact with the N-type conductive region 203 in terms of electron exchange.

The source electrode 210 forms an ohmic contact with the N-type conductive region 203 in terms of electron exchange.

As shown in FIG. 37, the punch-through electrode 215 and the source electrode 210 are electrically short-circuited with each other.

A gate electrode 211 is formed over a gate insulation film 224. Hence, a gate having a MIS (Metal-Insulator-Semiconductor) structure is formed. The gate electrode 211 may be made of various materials. Examples include a Ni-based alloy and a Pt-based alloy. The material of the gate insulation film 224 is not particularly limited, and examples include $SiO_2$, SiNx, $Al_2O_3$, AlN, and diamond. AlN and diamond are semiconductors, and at the same time, can be used as an insulation film.

The horizontal distance between the source electrode 210 and the gate electrode 211 is 5 μm or less, and preferably 2 μm or less. It is preferable that the horizontal distance between the gate electrode 211 and the drain electrode 212 be greater than the film thickness of the low-concentration withstand voltage control layer 204, and it is more preferable that the horizontal distance be 1.2 or more times as great as the film thickness.

There are no electrodes that form an ohmic contact and an indirect ohmic connection with the P-type barrier region 202. Therefore, the P-type barrier region 202 is PN-junction-isolated from all of the electrodes by means of the N-type conductive region 203 and the N-type carrier supply region 201, and is electrically floating. This makes it possible to save the production cost of the device significantly.

It is preferable that the width of a depletion layer between the N-type conductive region 203 and the P-type barrier region 202 during zero bias (Vds=0 V) be greater than the width of a depletion layer between the P-type barrier region 202 and the N-type carrier supply region 201. Specifically, the former width is twice or more times as great as the latter width, and more preferably 5 or more times as great.

An operation of the SiC-MISFET during an On state and an Off state is the same as that of the nitride semiconductor HFET according to the first embodiment, and an I-V characteristic of the device corresponds to FIG. 6.

Figure 38:
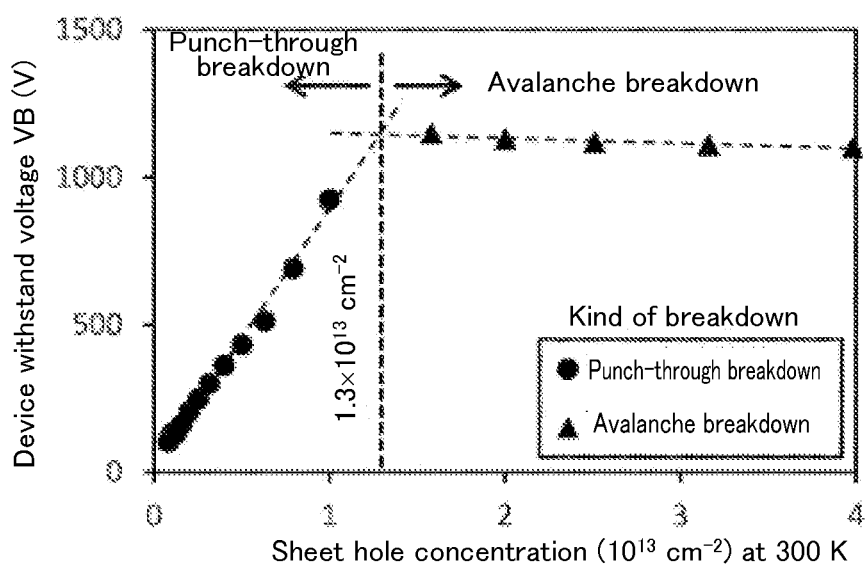
FIG. 38 shows a result of simulation of a device withstand voltage of the SiC-MISFET of FIG. 37 at 300 K.

The BV value of the SiC-MISFET of FIG. 37 with respect to the sheet hole concentration in the P-type barrier region 202 at 300 K was examined based on a device simulation virtual experiment. FIG. 38 shows the result of the simulation. Breakdowns due to punch-through occurred at a sheet hole concentration of $1.3\times10^{13}$ cm$^{-2}$ or lower, whereas avalanche breakdowns occurred at a sheet hole concentration equal to or higher than that. Hence, the sheet hole concentration of the SiC semiconductor device of the present invention is $1.3\times10^{13}$ cm$^{-2}$ or lower. Here, a sheet hole concentration (unit: cm$^{-2}$) is a value obtained by integrating the hole concentration (unit: cm$^{-3}$) in the P-type barrier region 202 located below the drain electrode 212 in a direction perpendicular to the surface of the substrate.

A two-dimensional hole gas formed by negative polarization at a heterojunction interface between different SiC polytypes may be used as the P-type barrier region 202. Specific examples include polarization at a 3C—SiC/6H—SiC heterojunction, and polarization at 3C—SiC/4H—SiC heterojunction. By utilizing polarization, it is possible to suppress a punch-through breakdown voltage variation due to temperature variation.

The SiC-MISFET structure according to the present invention shown in FIG. 37 may be modified within the spirit of the present invention. Specific modified examples will be described below.

Although not shown in FIG. 37, various semiconductors, insulators, and metals may be inserted between the substrate 200 and the N-type carrier supply region 201, without departing from the spirit of the present invention. For example, a layer structure made of SiC of the same polytype as that of the substrate 200 or of the N-type carrier supply region 201 may be inserted.

Further, although not shown in FIG. 37, it is preferable that the surface of the device be covered with an insulation protection film. Examples of the insulation film include $SiO_2$, $SiN_x$, $Al_2O_3$, AlN and diamond.

Further, as shown in FIG. 39, the P-type contact region 206 may be connected with the P-type barrier region 202. This makes it possible for the source electrode 210 to serve the function of a punch-through auxiliary electrode 216. This leads to suppression of an On resistance in switching.

Further, modifications intended for the same purposes as those of the modified examples of the first embodiment of the present invention may also be made to the SiC-MISFET. The second embodiment has presented an N-channel-type MISFET. However, it is possible to apply the present invention to a P-channel-type MISFET by interchanging N-type with P-type, a donor with an acceptor, positive polarization with negative polarization, and electrons with holes.

Further, the second embodiment has explained a SiC-MISFET. However, it is possible to apply the present invention to a MISFET made of any other wide band gap semiconductor such as a nitride semiconductor, an oxide semiconductor, and diamond.

However, it is preferable that the path along which a breakdown current flows be made of one kind of wide band gap semiconductor. If it is made of two or more kinds of wind band gap semiconductors, flow of electrons and holes is hindered at the junction interface between them, which makes it difficult to let occur a punch-through breakdown that is uniform throughout the device. Specifically, it is preferable that the N-type contact region 207, the N-type conductive region 203, the low-concentration withstand voltage control region 204, the P-type barrier region 202, and the N-type carrier supply region 201, which fall on the breakdown current path 220 in FIG. 37, be made of the same kind of wide band gap semiconductor.

Furthermore, in order to let a uniform punch-through breakdown occur, it is preferable that the band offset at a heterojunction interface, if there is any in the breakdown current path 220, be small. Specifically, in an N-channel-type device, a conduction band offset is preferably 0.5 eV or less, and more preferably 0.1 eV or less. In a P-channel-type device, a valence band offset is preferably 0.5 eV or less, and more preferably 0.1 eV or less.

Example 3

Figure 40:
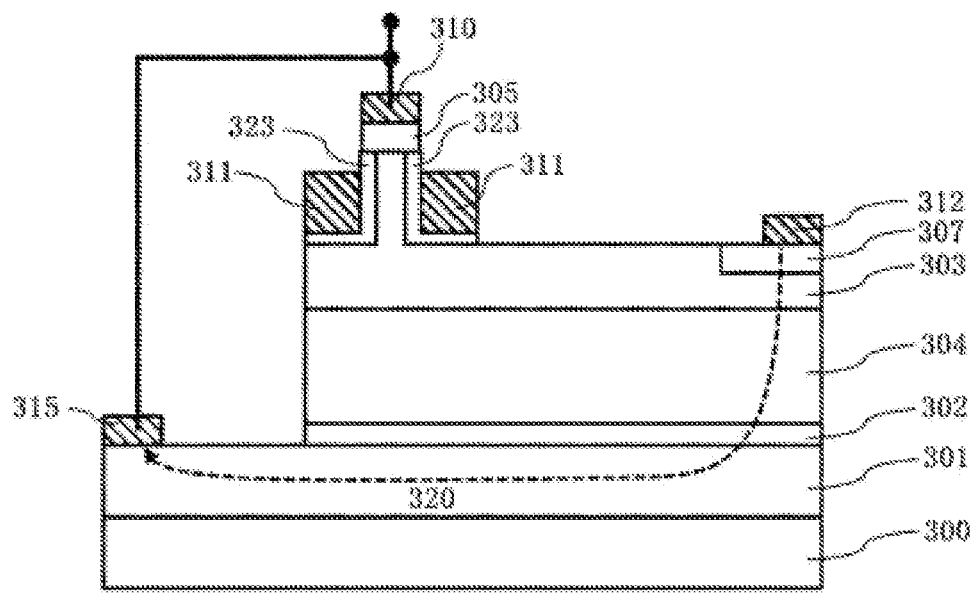
FIG. 40 is a cross-sectional configuration diagram of a SiC-JFET according to a third embodiment.

In the third embodiment of the present invention, a JFET made of SiC, which is the third embodiment, will be explained. FIG. 40 shows a configuration diagram of a MISFET made of SiC according to the present invention. The semiconductor material forming the MISFET is SiC, except for a substrate 300. It is preferable that the polytype of SiC be 3C, 6H, and 4H. The substrate 300 may be made of a material other than SiC.

Further, a polytype is particularly preferably 6H and 4H of a hexagonal crystal system, and it is preferable that the layer structure be formed in a c-axis direction of a hexagonal crystal structure. The c-axis direction is a [0001] or [000-1] direction. A dielectric constant in the c-axis direction is higher than the dielectric constant in the a-axis direction. Therefore, the trade-off among a punch-through breakdown voltage, an avalanche breakdown voltage, and a characteristic On resistance can be resolved, and a high device withstand voltage and an On resistance can be achieved simultaneously within a small chip area.

It is preferable that the material of the substrate 300 be a material over which a high-quality SiC crystal growth can be realized. It is particularly preferable that the material be the same polytype as a growth layer formed over the material itself, and be a c-plane SiC substrate. Other examples of the material include a Si substrate, a SOI (Silicon-on-Insulator) substrate, a SOS (Silicon-on-Sapphire) substrate, a sapphire substrate, a SiC substrate, a diamond substrate, and a nitride semiconductor substrate. A preferable plain orientation of the substrate is a (0001) plane or a (000-1) plane of a hexagonal crystal system, and a (111) plane of a cubic crystal system. With this feature, it is possible to form the layer structure shown in FIG. 40 in the c-axis direction.

An N-type carrier supply region 301 is formed over the substrate 300. The N-type carrier supply region 301 is made of SiC having an N-type conductivity. In order to impart the N-type conductivity, it is preferable to dope the region with a donor impurity, and it is more preferable to dope the region with N (nitrogen). The N doping concentration is preferably $5 \times 10^{16}$ cm$^{-3}$ or higher, and more preferably $3 \times 10^{17}$ cm$^{-3}$. However, depending on the growth conditions, it is possible to obtain an N-type SiC without doping. Therefore, it is possible to produce the N-type carrier supply region 301 without doping.

A P-type barrier region 302 is formed over the N-type carrier supply region 301. In order to impart the P-type conductivity, it is preferable to dope the region with an acceptor impurity, and it is more preferable to dope the region with Al. The Al doping concentration is preferably $1 \times 10^{16}$ cm$^{-3}$ or higher, and more preferably $3 \times 10^{16}$ cm$^{-3}$ or higher. When the Al concentration is increased, a hole activation rate at or about room temperature falls. Hence, due to heat generation at the location at which a breakdown occurs in the device, the hole activation rate rises, which automatically suppresses the punch-through breakdown. Therefore, the breakdown can occur uniformly throughout the device. However, an excessively high Al concentration leading to an activation rate fall accompanies an excessive punch-through breakdown voltage variation due to temperature variation. In the worst case, the punch-through breakdown voltage rises as the temperature rises and may reach an avalanche breakdown voltage. Therefore, the Al concentration is preferably $2 \times 10^{19}$ cm$^{-3}$ or lower, and more preferably $5 \times 10^{18}$ cm$^{-3}$ or lower.

A low-concentration withstand voltage control region 304 is formed over the P-type barrier region 302. The low-concentration withstand voltage control region 304 is made of a low-concentration P-type, a low-concentration N-type, and a semi-insulating SiC. In order to suppress the carrier concentration, it is preferable to produce this region without doping. However, it is possible to add an N donor or Al acceptor at a low concentration. Further, in order to impart a high resistivity, it is possible to add an impurity such as 0 and C that forms a deep level. The carrier concentration is preferably $1 \times 10^{16}$ cm$^{-3}$ or lower, and more preferably $5 \times 10^{15}$ cm$^{-3}$ or lower. The film thickness is an important parameter that determines the withstand voltage, and needs to be designed based on the withstand voltage. The film thickness is 0.7 μm or greater when the withstand voltage is 200 V or higher, and 2.1 μm or greater when the withstand voltage is 600 V or higher.

An N-type conductive region 303 is formed over the low-concentration withstand voltage control region 304. During an On state of the device, electrons, which are the carriers, flow from a source electrode 310 to a drain electrode 312 through the N-type conductive region 303. The sheet electron concentration in the N-type conductive region 303 at 300 K is $3 \times 10^{12}$ cm$^{-2}$ or higher, and more preferably $6 \times 10^{12}$ cm$^{-2}$ or higher. It is preferable that the sheet electron concentration in the N-type conductive region 303 be higher than the sheet hole concentration in the P-type barrier region 302. This makes it possible to let a punch-through breakdown occur stably. Here, the sheet electron concentration is a value obtained by integrating the electron concentration in the N-type conductive region 303 in a direction perpendicular to the surface of the substrate.

An N-type contact region 305 is formed, so that a contact resistance of the source electrode 310 may be suppressed. Further, an N-type contact region 307 is formed, so that a contact resistance of the drain electrode 312 may be suppressed.

A punch-through electrode 315 forms an ohmic contact with the N-type carrier supply region 301 in terms of electron exchange.

The drain electrode 312 forms an ohmic contact with the N-type conductive region 303 in terms of electron exchange.

The source electrode 310 forms an ohmic contact with the N-type conductive region 303 in terms of electron exchange.

As shown in FIG. 40, the punch-through electrode 315 and the source electrode 310 are electrically short-circuited with each other.

A gate electrode 311 is formed over a P-type gate region 323. Hence, a gate having a PN junction structure is formed. It is preferable that the material of the P-type gate region 323 be SiC of the same polytype as the N-type conductive region 303.

The horizontal distance between the source electrode 310 and the gate electrode 311 is 5 μm or less, and preferably 2 μm or less. It is preferable that the horizontal distance between the gate electrode 311 and the drain electrode 312 be greater than the film thickness of the low-concentration withstand voltage control layer 304, and it is more preferable that the horizontal distance be 1.2 or more times as great as the film thickness.

There are no electrodes that form an ohmic contact and an indirect ohmic connection with the P-type barrier region 302. Therefore, the P-type barrier region 302 is PN-junction-isolated from all of the electrodes by means of the N-type conductive region 303 and the N-type carrier supply region 301, and is electrically floating. This makes it possible to save the production cost of the device significantly.

It is preferable that the width of a depletion layer between the N-type conductive region 303 and the P-type barrier region 302 during zero bias (Vds=0 V) be greater than the width of a depletion layer between the P-type barrier region 302 and the N-type carrier supply region 301. Specifically, the former width is twice or more times as great as the latter width, and more preferably 5 or more times as great.

An operation of the SiC-JFET during an On state and an Off state is the same as that of the nitride semiconductor HFET according to the first embodiment, and an I-V characteristic of the device corresponds to FIG. 6.

The BV value at 300 K was examined based on a device simulation virtual experiment. As a result, breakdowns due to punch-through occurred at a sheet hole concentration of $1.3 \times 10^{13}$ cm$^{-2}$ or lower, whereas avalanche breakdowns occurred at a sheet hole concentration equal to or higher than that. Hence, the sheet hole concentration of the SiC semiconductor device of the present invention is $1.3 \times 10^{13}$ cm$^{-2}$ or lower. Here, a sheet hole concentration (unit: cm$^{-2}$) is a value obtained by integrating the hole concentration (unit: cm$^{-3}$) in the P-type barrier region 302 located below the drain electrode 312 in a direction perpendicular to the surface of the substrate.

A two-dimensional hole gas formed by negative polarization at a heterojunction interface between different SiC polytypes may be used as the P-type barrier region 302. Specific examples include polarization at a 3C—SiC/6H—SiC heterojunction, and polarization at 3C—SiC/4H—SiC heterojunction. By utilizing polarization, it is possible to suppress a punch-through breakdown voltage variation due to temperature variation.

The SiC-JFET structure according to the present invention shown in FIG. 40 may be modified within the spirit of the present invention. Specific modified examples will be described below.

Although not shown in FIG. 40, various semiconductors, insulators, and metals may be inserted between the substrate 300 and the N-type carrier supply region 301, without departing from the spirit of the present invention. For example, a layer structure made of SiC of the same polytype as that of the substrate 300 or of the N-type carrier supply region 301 may be inserted.

Further, although not shown in FIG. 40, it is preferable that the surface of the device be covered with an insulation protection film. Examples of the insulation film include $SiO_2$, $SiN_x$, $Al_2O_3$, AlN, and diamond.

Further, modifications intended for the same purposes as those of the modified examples of the first embodiment of the invention and the second embodiment of the invention may also be made to the SiC-JFET. The third embodiment has presented an N-channel-type JFET. However, it is possible to apply the present invention to a P-channel-type JFET by interchanging N-type with P-type, a donor with an acceptor, positive polarization with negative polarization, and electrons with holes.

Further, the third embodiment has explained a SiC-JFET. However, it is possible to apply the present invention to a JFET made of any other wide band gap semiconductor such as a nitride semiconductor, an oxide semiconductor, and diamond.

However, it is preferable that the path along which a breakdown current flows be made of one kind of wide band gap semiconductor. If it is made of two or more kinds of wind band gap semiconductors, flow of electrons and holes is hindered at the junction interface between them, which makes it difficult to let occur a punch-through breakdown that is uniform throughout the device. Specifically, it is preferable that the N-type contact region 307, the N-type conductive region 303, the low-concentration withstand voltage control region 304, the P-type barrier region 302, and the N-type carrier supply region 301, which fall on a breakdown current path 320 in FIG. 40, be made of the same kind of wide band gap semiconductor.

Furthermore, in order to let a uniform punch-through breakdown occur, it is preferable that the band offset at a heterojunction interface, if there is any in the breakdown current path 320, be small. Specifically, in an N-channel-type device, a conduction band offset is preferably 0.5 eV or less, and more preferably 0.1 eV or less. In a P-channel-type device, a valence band offset is preferably 0.5 eV or less, and more preferably 0.1 eV or less.

Example 4

Figure 41:
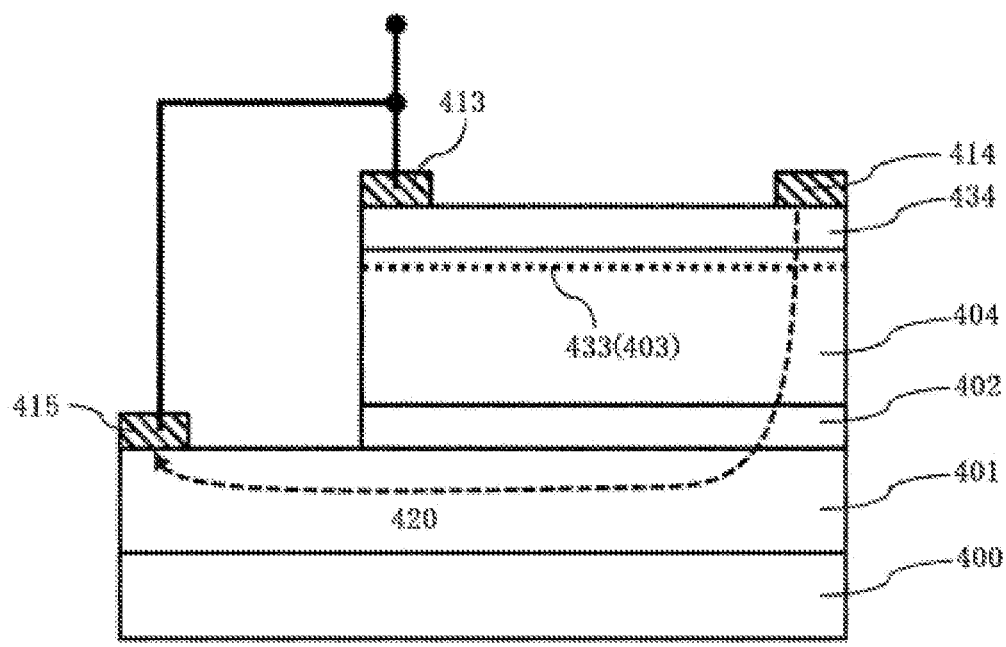
FIG. 41 is a cross-sectional configuration diagram of a nitride semiconductor SBD according to a fourth embodiment.

In the fourth embodiment of the present invention, a SBD made of a nitride semiconductor, which is the fourth embodiment, will be explained. FIG. 41 shows a configuration diagram of the nitride semiconductor SBD according to the present invention. It is possible to apply the present invention to a diode, by replacing the source electrode 110 of as per the first embodiment of the present invention, with an node electrode 413 having a Schottky characteristic with respect to an N-type conductive region 403, replacing the drain electrode 112 of as per the first embodiment of the present invention, with a cathode electrode 414 having an ohmic characteristic with respect to the N-type conductive region 403, replacing an On state of the first embodiment with a forwardly biased diode state in which the electric potential of the anode electrode 413 (hereinafter, Vac) with respect to the electric potential of the cathode electrode 414 is a positive value, and a current flows from the anode electrode 413 to the cathode electrode 414, and replacing an Off state of the first embodiment with a reversely biased diode state in which the Vac is a negative value, and no current flows between the anode electrode 413 and the cathode electrode 414.

Specifically, the semiconductor material forming the SBD except for a substrate 400 is a nitride semiconductor of which chemical formula is represented by the formula (4) below.

$$B_xAl_yIn_zGa_{1-x-y-z}N \qquad (4)$$

In the formula, x, y, and z have values that satisfy $0 \leq x \leq 1$, $0 \leq y \leq 1$, $0 \leq z \leq 1$, and $x+y+z \leq 1$. The substrate 400 may be made of a material other than a nitride semiconductor.

It is preferable to form the layer structure of the present invention in a c-axis direction of a hexagonal crystal structure. The c-axis direction is a [0001] or [000−1] direction.

It is preferable that the material of the substrate 400 be a material over which a high-quality crystal growth of a nitride semiconductor can be realized. Examples of the material include a Si substrate, a SOI (Silicon-on-Insulator) substrate, a SOS (Silicon-on-Sapphire) substrate, a sapphire substrate, a SiC substrate, a diamond substrate, and a nitride semiconductor substrate. A preferable plain orientation of the substrate is a (0001) plane or a (000-1) plane of a hexagonal crystal system, and a (111) plane of a cubic crystal system. With this feature, it is possible to form the layer structure shown in FIG. 41 in the c-axis direction.

An N-type carrier supply region 401 is formed over the substrate 400. The N-type carrier supply region 401 is made of a nitride semiconductor having an N-type conductivity. It is preferable that the N-type carrier supply region 401 be made of N-type InAlGaN, AlGaN, GaN, InAlN, or InGaN. The region may be a multilayer film formed of two or more kinds of nitride semiconductor layers having different compositions. In order to impart the N-type conductivity, it is preferable to dope the region with a donor impurity, and it is more preferable to dope the region with Si. The Si doping concentration is preferably $5 \times 10^{16}$ cm$^{-3}$ or higher, and more preferably $3 \times 10^{17}$ cm$^{-3}$. However, depending on the growth conditions, it is possible to obtain an N-type nitride semiconductor without doping. Therefore, it is possible to produce the N-type carrier supply region 401 without doping. The film thickness of the N-type carrier supply region 401 is preferably 10 nm or greater, and more preferably 100 nm or greater.

A P-type barrier region 402 is formed over the N-type carrier supply region 401. The P-type barrier region 402 is made of a nitride semiconductor having a P-type conductivity. It is preferable that the P-type barrier region 402 be made of P-type InAlGaN, AlGaN, GaN, InAlN, or InGaN. The region may be a multilayer film formed of two or more kinds of nitride semiconductor layers having different compositions.

In order to impart the P-type conductivity, it is preferable to dope the region with an acceptor impurity, and it is more preferable to dope the region with Mg. The Mg doping concentration is preferably $1 \times 10^{16}$ cm$^{-3}$ or higher, and more preferably $3 \times 10^{16}$ cm$^{-3}$ or higher. When the Mg concentration is increased, a hole activation rate at or about room temperature falls. Hence, due to heat generation at the location at which a breakdown occurs in the device, the hole activation rate rises, which automatically suppresses the punch-through breakdown. Therefore, the breakdown can occur uniformly throughout the device. However, an excessively high Mg concentration leading to an activation rate fall accompanies an excessive punch-through breakdown voltage variation due to temperature variation. In the worst case, the punch-through breakdown voltage rises as the temperature rises and may reach an avalanche breakdown voltage. Therefore, the Mg concentration is preferably $2 \times 10^{19}$ cm$^{-3}$ or lower, and more preferably $5 \times 10^{18}$ cm$^{-3}$ or lower. Further, it is possible to suppress temperature variation by using InGaN in which the In composition is from 2% to 30% for the N-type carrier supply region 401.

A low-concentration withstand voltage control region 404 is formed over the P-type barrier region 402. The low-concentration withstand voltage control region 404 is made of a low-concentration P-type, a low-concentration N-type, and a semi-insulating nitride semiconductor. It is preferable that the low-concentration withstand voltage control region 404 be made of InAlGaN, AlGaN, GaN, InAlN, or InGaN having a low carrier concentration. The region may be a multilayer film formed of two or more nitride semiconductor layers having different compositions. In order to suppress the carrier concentration, it is preferable to produce this region without doping. However, it is possible to add a Si donor or Mg acceptor at a low concentration. Further, in order to impart a high resistivity, it is possible to add an impurity such as 0 and C that forms a deep level. The carrier concentration is preferably $1 \times 10^{16}$ cm$^{-3}$ or lower, and more preferably $5 \times 10^{15}$ cm$^{-3}$ or lower. The film thickness is an important parameter that determines the withstand voltage, and needs to be designed based on the withstand voltage. The film thickness is 0.5 μm or greater when the withstand voltage is 200 V or higher, and 1.5 μm or greater when the withstand voltage is 600 V or higher.

A surface barrier layer 434 is formed over the low-concentration withstand voltage control region 404. With positively polarized charges induced at the heterojunction interface between the low-concentration withstand voltage control region 404 and the surface barrier layer 434, a two-dimensional electron gas 433 is formed. It is possible to obtain a two-dimensional electron gas 433 having a high density by forming the surface barrier layer 434 from a nitride semiconductor layer having a band gap greater than that of the low-concentration withstand voltage control region 404. It is preferable that the film thickness of the surface barrier layer 434 be in the range of from 2 nm to 70 nm.

During an On state of the device, electrons, which are the carriers, flow from the cathode electrode 414 to the anode electrode 413 via the two-dimensional electron gas 433. Hence, the two-dimensional electron gas 433 serves the function of the N-type conductive region 403. The surface barrier layer 434 may be wholly or partially doped with Si, which makes it possible to increase the carrier density of the two-dimensional electron gas 433 and reduce the On resistance of the device. In this case, the Si doping concentration is preferably $5 \times 10^{19}$ cm$^{-3}$ or lower, and more preferably $1 \times 10^{19}$ cm$^{-3}$. However, the positive polarization at the hetero-interface makes it possible to form the two-dimensional electron gas 433 without doping. Therefore, the surface barrier layer 434 may be produced without doping. Further, the surface barrier layer 434 may be a multilayer film formed of two or more nitride semiconductor layers having different compositions. Specifically, the surface barrier layer 434 may be formed of a two-layered structure made of InGaN/InAlGaN, or the surface barrier layer 434 may be formed of a two-layered structure made of GaN/AlGaN.

Here, a two-dimensional electron gas means electrons that are induced by positively polarized charges at a heterojunction interface and distributed two-dimensionally near the heterojunction interface.

The sheet electron concentration in the N-type conductive region 403 at 300 K is $5 \times 10^{12}$ cm$^{-2}$ or higher, and more preferably $1 \times 10^{13}$ cm$^{-2}$ or higher. It is preferable that the sheet electron concentration in the N-type conductive region 403 be higher than the sheet hole concentration in the P-type barrier region 402. This makes it possible to let a punch-through breakdown occur stably. Here, a sheet electron concentration is a value obtained by integrating the electron concentration in the N-type conductive region 403 in a direction perpendicular to the surface of the substrate.

A punch-through electrode 415 forms an ohmic contact with the N-type carrier supply region 401 in terms of electron exchange. The material of the punch-through electrode 415 may be a Ti-based alloy.

The cathode electrode 414 forms an ohmic contact with the N-type conductive region 403 in terms of electron exchange. The material of the cathode electrode 414 may be a Ti-based alloy.

The anode electrode 413 forms an Schottky contact with the N-type conductive region 403 in terms of electron exchange. The material of the anode electrode 413 may be a Ni-based alloy or a Pt-based alloy.

As shown in FIG. 41, the punch-through electrode 415 and the anode electrode 413 are electrically short-circuited with each other.

It is preferable that the horizontal distance between the anode electrode 413 and the cathode electrode 414 be greater than the film thickness of the low-concentration withstand voltage control layer 404, and it is more preferable that the horizontal distance be 1.2 or more times as great as the film thickness.

There are no electrodes that form an ohmic contact and an indirect ohmic connection with the P-type barrier region 402. Therefore, the P-type barrier region 402 is PN-junction-isolated from all of the electrodes by means of the N-type conductive region 403 and the N-type carrier supply region 401, and is electrically floating. This makes it possible to save the production cost of the device significantly.

Figure 42:
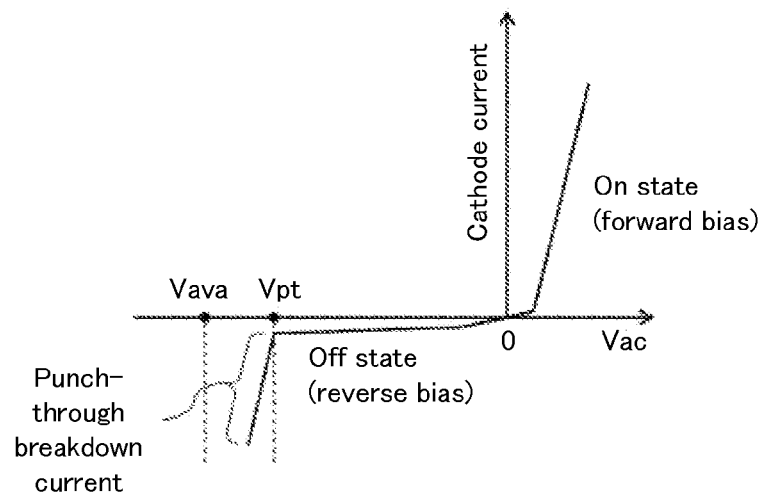
FIG. 42 is a schematic diagram of an I-V characteristic explaining a behavior of the nitride semiconductor SBD of FIG. 41.

An operation of the nitride semiconductor SBD shown in FIG. 41 will be explained below. FIG. 42 shows a schematic diagram of an I-V characteristic of the nitride semiconductor SBD. Here, it is assumed that a current that flows out from a semiconductor to a cathode electrode is a positive cathode current, and a current that flows from a cathode electrode into a semiconductor is a negative cathode electrode. In the structure of FIG. 42, a band structure at Vac=0 V corresponds to FIG. 5 of the first embodiment of the invention. During an On state equivalent to a forwardly biased diode state in which the Vac is a positive value, electrons are carried from the cathode electrode 414 toward the anode electrode 413 via the N-type conductive region 403. Electrons have negative charges. Therefore, an On current flows from the anode electrode 413 toward the cathode electrode 414.

When a negative Vac is applied during an Off state equivalent to a reversely biased diode state in which the Vac is a negative value, a weak leakage current flows as shown in FIG. 42. The value of the leakage current is equal to or less than $1/1,000$ of an On current during an On state, and more preferably equal to or less than $1/10,000$.

When the Vac is increased toward the negative direction, hole depletion occurs in a portion of the P-type barrier region 402, particularly in a portion thereof located perpendicularly below the cathode electrode 414. When the Vac reaches a punch-through breakdown voltage Vpt, the N-type conductive region 403 and the N-type carrier supply region 401 become connected with each other through a depletion layer, bringing about a punch-through breakdown state. As a result, electrons are injected from the punch-through electrode 415, pass the N-type carrier supply region 401 and the hole-depleted portion of the P-type barrier region 402, and reach the cathode electrode 414. A path 420 along which the punch-through breakdown current flows is reverse to the flow of electrons having negative charges. By the occurrence of the punch-through, a cathode current flows even though the device is in the Off state, at a Vac higher than Vpt in the negative direction, as shown in FIG. 42.

The band structure in a semiconductor region located below the cathode electrode 414 during this punch-through breakdown corresponds to FIG. 7 of the first embodiment of the invention.

In this punch-through breakdown state, a current flows from the cathode electrode 414 toward the punch-through electrode 415, and substantially no current flows between the cathode electrode 414 and the anode electrode 413. Specifically, any current that flows between the cathode electrode 414 and the anode electrode 413 is equal to or less than $1/1,000$, and more preferably equal to or less than $1/10,000$ of the current that flows from the cathode electrode 414 toward the punch-through electrode 415.

The voltage Vpt of the semiconductor device according to the present invention is designed so as to be lower than an avalanche breakdown voltage Vava, so as not for an avalanche breakdown to occur. This makes it possible to prevent destruction due to an avalanche breakdown. A device withstand voltage BV of the semiconductor device according to the present invention is determined by Vpt.

Here, BV of the semiconductor device is a voltage at which an Off state can no longer be maintained and a current starts to flow. In a diode, BV is a voltage Vac at which a cathode current starts to flow.

The BV value of the nitride semiconductor SBD of FIG. 41 with respect to the sheet hole concentration in the P-type barrier region 402 at 300 K was examined based on a device simulation virtual experiment. As a result, breakdowns due to punch-through occurred at a sheet hole concentration of $1.7 \times 10^{13}$ cm$^{-2}$ or lower, whereas avalanche breakdowns occurred at a sheet hole concentration equal to or higher than that. Hence, the sheet hole concentration of the semiconductor device according to the present invention made of a nitride semiconductor is $1.7 \times 10^{13}$ cm$^{-2}$ or lower.

Here, a sheet hole concentration (unit: cm$^{-2}$) is a value obtained by integrating the hole concentration (unit: cm$^{-3}$) in the P-type barrier region 402 located below a drain electrode 412 in a direction perpendicular to the surface of the substrate.

The structure of the nitride semiconductor device according to the present invention shown in FIG. 41 may be modified within the spirit of the present invention. Specific modified examples will be described below.

Although not shown in FIG. 41, various semiconductors, insulators, and metals may be inserted between the substrate 400 and the N-type carrier supply region n401 without departing from the spirit of the present invention. Particularly, it is possible to incorporate an initial growth layer in order to improve the crystallinity of the nitride semiconductor. Specific examples include a low-temperature GaN buffer layer, a low-temperature AlGaN buffer layer, a low-temperature AlN buffer layer, and various insulators for lateral growth, which are used commonly.

Although not shown in FIG. 41, it is preferable that the surface of the device be covered with an insulation protection film. Examples of the insulation film include $SiO_2$, $SiN_x$, $Al_2O_3$, AlN, and diamond.

Although not shown in FIG. 41, it is possible to insert a spacer layer between the surface barrier layer 434 and the low-concentration withstand voltage control region 404. By inserting a spacer layer, it is possible to improve the mobility and to thereby lower the On resistance. A spacer layer is a nitride semiconductor, and has a band gap energy higher than that of the surface barrier layer 434. A preferable example thereof is an AlN layer having a thickness of 3 nm or less.

Although not shown in FIG. 41, it is possible to insert a well layer between the surface barrier layer 434 and the low-concentration withstand voltage control region 404 for promoting carrier trapping. This makes it possible to suppress a leakage current during an Off state. A well layer is a nitride semiconductor, and has a band gap energy lower than that of the low-concentration withstand voltage control region 404. A preferable example thereof is an InGaN layer having a thickness of 500 nm or less. A more preferable example thereof is an InGaN layer having a thickness of 50 nm or less.

Further, it is possible to make modifications intended for the same purposes as those of the modified examples of the first embodiment of the invention, by replacing the source electrode 110 of the first embodiment with the node electrode 413 having a Schottky characteristic with respect to the N-type conductive region 403, replacing the drain electrode 112 of the first embodiment with the cathode electrode 414 having an ohmic characteristic with respect to the N-type conductive region 403, replacing an On state of the first embodiment with a forwardly biased diode state in which the Vac is a positive value, and a current flows from the anode electrode 413 to the cathode electrode 414, and replacing an Off state of the first embodiment with a reversely biased diode state in which the Vac is a negative value, and no current flows between the anode electrode 413 and the cathode electrode 414.

The fourth embodiment has presented a SBD in which the carriers carrying an On current during an On state are electrons. However, it is possible to apply the present invention to a SBD in which the carriers are holes, by interchanging N type with P type, a donor with an acceptor, positive polarization with negative polarization, and electrons with holes. Further, it is also possible to apply the present invention to a diode other than a SBD. Particularly, the present invention is effective for a unipolar diode such as a JBSD.

The fourth embodiment has explained a SBD made of a nitride semiconductor. However, it is also possible to apply the present invention to a SBD made of any other wide band gap semiconductor such as SiC, an oxide semiconductor, and diamond.

However, it is preferable that the path along which a breakdown current flows be made of one kind of wide band gap semiconductor. If it is made of two or more kinds of wind band gap semiconductors, flow of electrons and holes is hindered at the junction interface between them, which makes it difficult to let occur a punch-through breakdown that is uniform throughout the device. Specifically, it is preferable that the surface barrier layer 434, the low-concentration withstand voltage control region 404, the P-type barrier region 402, and the N-type carrier supply region 401, which fall on the breakdown current path 420 in FIG. 41, be made of the same kind of wide band gap semiconductor.

Here, wide band gap semiconductors are assumed to be of the same kind, when they include the same period 2 element of the periodic table as a main component to constitute the crystal of the wide band gap semiconductors.

Furthermore, in order to let a uniform punch-through breakdown occur, it is preferable that the band offset at the heterojunction interfaces be small in the breakdown current path 420. Specifically, in such a device as in FIG. 41 in which electrons carry an On current, a conduction band offset is preferably 0.5 eV or less, and more preferably 0.1 eV or less. In a device in which holes carry an On current, a valence band offset is preferably 0.5 eV or less, and more preferably 0.1 eV or less.

Example 5

In the fifth embodiment of the present invention, it is possible to produce an integrated circuit of power semiconductor devices on one chip, by producing a plurality of semiconductor devices according to the present invention on the same substrate. The problem of destruction by an avalanche breakdown is more severe in a one-chip integrated circuit, because a one-chip integrated circuit inevitably includes many semiconductor devices. That is, when one device in the integrated circuit is destroyed by an avalanche breakdown, the integrated circuit must be replaced on the whole, because it is impossible to replace the destroyed device alone. Hence, it costs more to replace, as the number of devices is greater. Semiconductor device according to the present invention can be prevented from being destroyed by an avalanche breakdown. Hence, when used on a one-chip integrated circuit, they can improve the reliability of the one-chip integrated circuit drastically.

Figure 43:
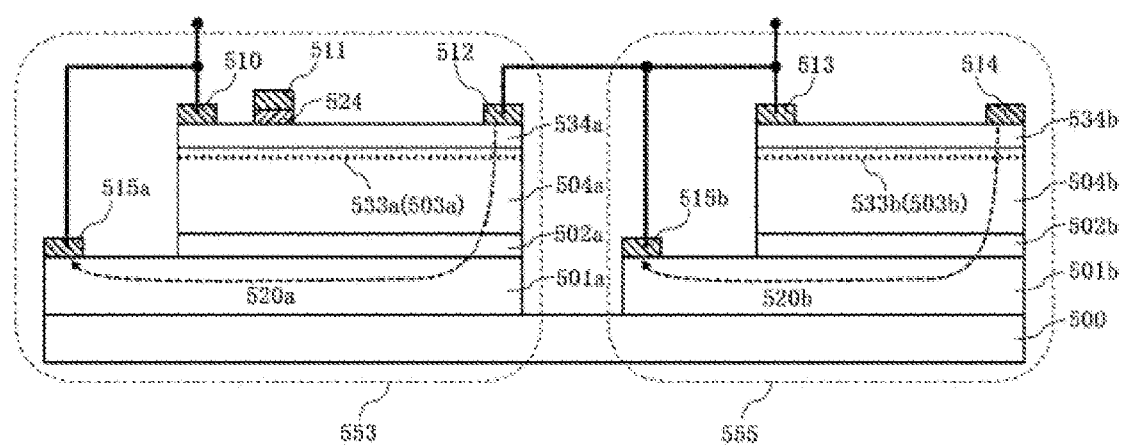
FIG. 43 is a cross-sectional configuration diagram of an integrated circuit of a nitride semiconductor according to a fifth embodiment.

FIG. 43 shows a configuration diagram of a simple integrated circuit in which a HFET 553 and SBD 555 that are made of a nitride semiconductor are combined on one chip, as one example of an integrated circuit according to the present invention. In this circuit, a drain electrode 512 of the HFET 553 and an anode electrode 513 of the SBD 555 are short-circuited with each other. This circuit can be used as a chopper circuit, which is one kind of DC-DC power converters.

The HFET 553 and the SBD 555 are formed on one-chip on the same substrate 500. An N-type carrier supply region 501a of the HFET 553 and an N-type carrier supply region 501b of the nitride semiconductor are electrically insulated from each other. Note that the reference signs 502a and 502b denote P-type barrier regions, the reference signs 503a and 503b denote N-type conductive regions, the reference signs 504a and 504b denote low-concentration withstand voltage control regions, the reference sign 510 denotes a source electrode, the reference numeral 511 denotes a gate electrode, the reference signs 515a and 515b denote punch-through electrodes, the reference signs 520a and 520b denote breakdown current paths, the reference sign 524 denotes a gate insulation film, the reference signs 533a and 533b denote two-dimensional electron gases, and the reference signs 534a and 534b denote surface barrier layers.

Figure 44:
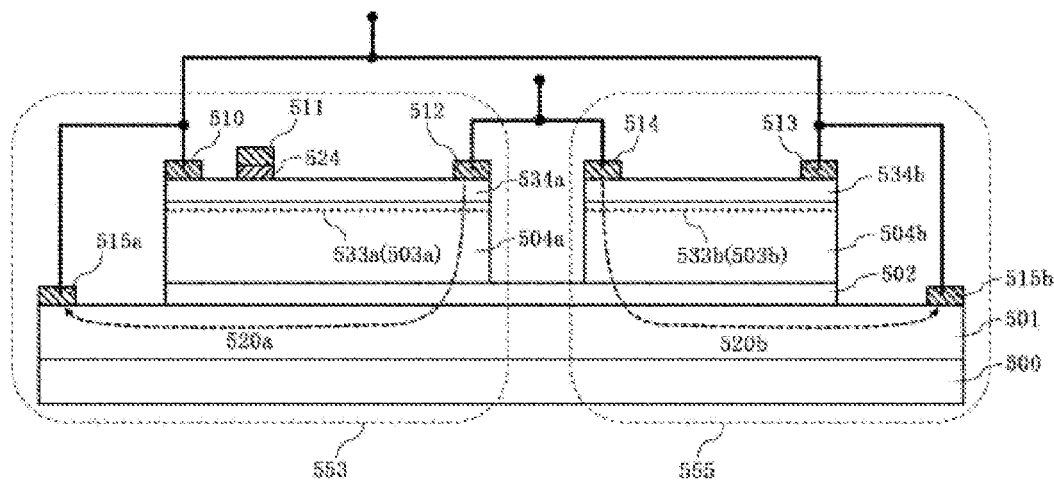
FIG. 44 is a cross-sectional configuration diagram of an integrated circuit of a nitride semiconductor according to the fifth embodiment.

FIG. 44 shows a configuration diagram of a simple integrate circuit in which HFET 553 and a SBD 555 that are made of a nitride semiconductor are combined on one chip, as an example of an integrated circuit according to the present invention. In this circuit, a drain electrode 512 of the HFET 553 and a cathode electrode 514 of the SBD 555, and a source electrode 510 of the HFET 553 and an anode electrode 513 of the SBD 555 are short-circuited with each other, respectively, and the circuit functions as a reverse conducting transistor on the whole. Here, the HFET 553 and the SBD 555 are formed on one chip on the same substrate 500. Furthermore, by producing a plurality of such reverse conducting transistors on the same substrate, it is possible to produce a main circuit of a power converter on one chip. For example, it is possible to realize a three-phase inverter circuit, by using six reverse conducting transistors.

Figure 45:
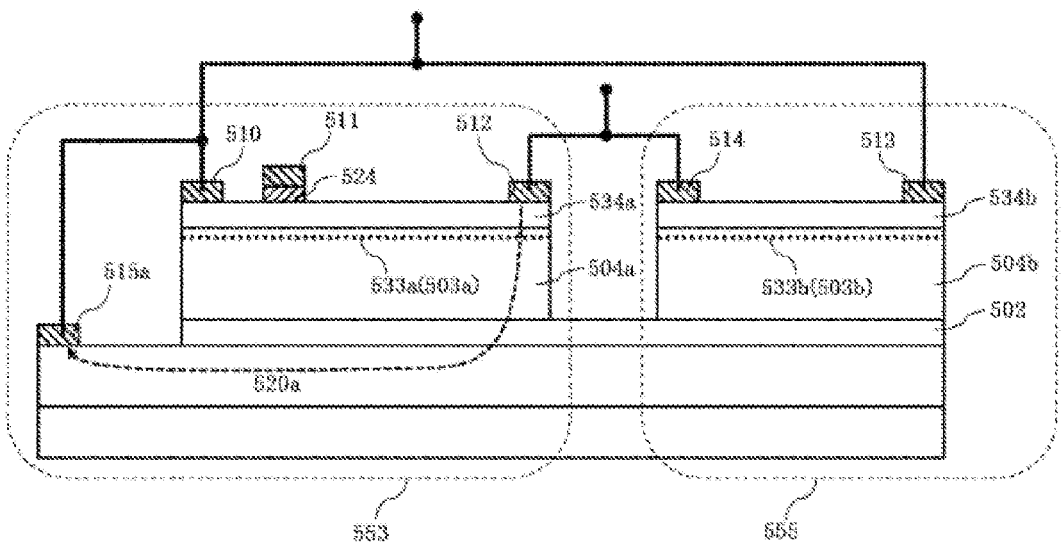
FIG. 45 is a cross-sectional configuration diagram of a modified example of the integrated circuit of the nitride semiconductor according to the fifth embodiment shown in FIG. 44.

Further, it is not indispensable for a one-chip integrated circuit according to the present invention to have a punch-through breakdown function in all of the semiconductor devices in the circuit. A device that is not at a risk of being destroyed by an overvoltage needs not have a punch-through breakdown function. This makes it possible to do without any unnecessary punch-through electrodes, and save the chip area of the one-chip integrated circuit. As one example thereof, FIG. 45 shows a modified example of the reverse conducting transistor of FIG. 44. The nitride semiconductor SBD 555 includes no punch-through electrode, whereas the nitride semiconductor transistor 553 connected in parallel has a punch-through breakdown function, which makes it possible to reduce the chip area as compared with FIG. 44, while preventing an avalanche breakdown in the SBD 555.

INDUSTRIAL APPLICABILITY

A semiconductor device according to the present invention can be mainly used for power converters (DC-DC, AC-DC, DC-AC, and AC-AC) and high-frequency power amplifiers.

REFERENCE SIGNS LIST 100 substrate
101 N-type carrier supply region
102, 102a, 102b P-type barrier region
103 N-type conductive region
104, 104a, 104b low-concentration withstand voltage control region
105 N-type contact region
107 N-type contact region
108 N-type contact region
109 P-type contact region
110, 110a, 110b source electrode
111, 111a, 111b gate electrode
112 drain electrode
115 punch-through electrode
116 punch-through auxiliary electrode
117 substrate electrode
120 breakdown current path
123 P-type gate region
124, 124a, 124b gate insulation film
125 N-type intermediate layer
126 N-type foundation layer
131 two-dimensional electron gas
132 two-dimensional hole gas
133 two-dimensional electron gas
134 surface barrier layer
135 GaN foundation layer
136 initial growth layer
137 heterogeneous substrate
138 polarization layer
139 N-type nitride semiconductor substrate
140 low-concentration region
150 punch-through control power supply
151 Si-MISFET
152 punch-through electrode insulation film
153 transistor having a punch-through breakdown function
154 resistor
156 diode
200 substrate
201 N-type carrier supply region
202 P-type barrier region
203 N-type conductive region
204 low-concentration withstand voltage control region
205 N-type contact region
206 P-type contact region
207 N-type contact region
210 source electrode
211 gate electrode
212 drain electrode
215 punch-through electrode
216 punch-through auxiliary electrode
220 breakdown current path
222 P-type region
224 gate insulation film
300 substrate
301 N-type carrier supply region
302 P-type barrier region
303 N-type conductive region
304 low-concentration withstand voltage control region
305 N-type contact region
307 N-type contact region
310 source electrode
311 gate electrode
312 drain electrode
315 punch-through electrode
320 breakdown current path
323 P-type gate region
400 substrate
401 N-type carrier supply region
402 P-type barrier region
403 N-type conductive region
404 low-concentration withstand voltage control region
413 anode electrode
414 cathode electrode
415 punch-through electrode
420 breakdown current path
433 two-dimensional electron gas
434 surface barrier layer
500 substrate
501a, 501b N-type carrier supply region
502a, 502b P-type barrier region
503a, 503b N-type conductive region
504a, 504b low-concentration withstand voltage control region
510 source electrode
511 gate electrode
512 drain electrode
513 anode electrode
514 cathode electrode
515a, 515b punch-through electrode
520a, 520b breakdown current path
524 gate insulation film
533a, 533b two-dimensional electron gas
534a, 534b surface barrier layer
553 wide band gap semiconductor transistor
555 wide band gap semiconductor diode

The invention claimed is:

1. A semiconductor device comprising:
A semiconductor structure configured to let a breakdown current occur due to a punch through breakdown,
wherein the breakdown current flows by passing through a heterojunction interface that comprises polarization charges having a same polarity as that of carriers carrying the breakdown current,
wherein the semiconductor structure comprises:
a first semiconductor region disposed over a substrate and having a first conductivity type;
a second semiconductor region having the first conductivity type; and
a third semiconductor region located between the first and second semiconductor regions and having a second conductivity type,
wherein the semiconductor device comprises:
a first electrode having an ohmic characteristic with respect to the first semiconductor region;
a second electrode having an ohmic characteristic with respect to the second semiconductor region; and
a third electrode having a contact with the second semiconductor region and adjacent to the second electrode, wherein when a voltage positive or negative with respect to the first and third electrodes is applied to the second electrode during an On state, an On current by carriers having the first conductivity type flows between the second and third electrodes, wherein when a voltage positive or negative with respect to the first and third electrodes is applied to the second electrode during an Off state, the breakdown current by carriers having the first conductivity type flows between the second electrode and the first electrode, and wherein a current value of a leakage current flowing between the second and third electrodes is at most equal to or less than $1/1,000$ of a current value of the On current.

2. The semiconductor device according to claim 1, wherein a semiconductor of the semiconductor structure has a hexagonal crystal structure, and the breakdown current flows in a direction of a c-axis of the semiconductor.

3. The semiconductor device according to claim 1, wherein the punch-through breakdown occurs by depletion of the third semiconductor region located between the substrate and the second electrode.

4. The semiconductor device according to claim 1, wherein the first electrode is electrically short-circuited with the third electrode.

5. The semiconductor device according to claim 1, wherein the third semiconductor region is electrically floating.

6. The semiconductor device according to claim 1, wherein the semiconductor device is a field effect transistor,
wherein the second electrode is a drain electrode,
wherein the third electrode is a source electrode, and
wherein the semiconductor device further comprises a gate electrode as a fourth electrode between the second electrode and the third electrode.

7. The semiconductor device according to claim 1, wherein the semiconductor device is a Schottky barrier diode,
wherein the second electrode is a cathode electrode,
wherein the third electrode is an anode electrode having a Schottky characteristic with respect to the second semiconductor region.

8. The semiconductor device according to claim 1, wherein the semiconductor device is a field effect transistor,
wherein the second electrode is a drain electrode,
wherein the third electrode is a source electrode,
wherein the semiconductor device further comprises a gate electrode as a fourth electrode between the second electrode and the third electrode, and
wherein the semiconductor device is cascoded with another transistor in which an avalanche breakdown occurs, by the source electrode being short-circuited with a drain electrode of the another transistor.

9. The semiconductor device according to claim 1, wherein a breakdown voltage of the punch-through breakdown is lower than an avalanche breakdown voltage.

10. The semiconductor device according to claim 1, wherein the semiconductor device is a unipolar transistor or a unipolar diode.

11. The semiconductor device according to claim 1, wherein a semiconductor of the semiconductor structure is a wide band gap semiconductor.

12. A semiconductor device comprising a semiconductor structure configured to let a breakdown current occur due to a punch through breakdown, wherein the semiconductor structure comprises:
a first semiconductor region disposed over a substrate and having a first conductivity type;
a second semiconductor region having the first conductivity type; and
a third semiconductor region located between the first and second semiconductor regions and having a second conductivity type,
wherein the semiconductor device comprises:
a first electrode having an ohmic characteristic with respect to the first semiconductor region;
a second electrode having an ohmic characteristic with respect to the second semiconductor region; and
a third electrode having a contact with the second semiconductor region and adjacent to the second electrode,
wherein when a voltage positive or negative with respect to the first and third electrodes is applied to the second electrode during an On state, an On current by carriers having the first conductivity type flows between the second and third electrodes,
wherein when a voltage positive or negative with respect to the first and third electrodes is applied to the second electrode during an Off state, the breakdown current by carriers having the first conductivity type flows between the second electrode and the first electrode, and
wherein a current value of a leakage current flowing between the second and third electrodes is at most equal to or less than $1/1,000$ of a current value of the On current.

13. The semiconductor device according to claim 12, wherein the punch-through breakdown occurs by depletion of the third semiconductor region located between the substrate and the second electrode.

14. The semiconductor device according to claim 12, wherein the first electrode is electrically short-circuited with the third electrode.

15. The semiconductor device according to claim 13, wherein the first electrode is electrically short-circuited with the third electrode.

16. The semiconductor device according to claim 12, wherein the third semiconductor region is electrically floating.

17. The semiconductor device according to claim 12, wherein the semiconductor device is a field effect transistor,
wherein the second electrode is a drain electrode,
wherein the third electrode is a source electrode, and
wherein the semiconductor device further comprises a gate electrode as a fourth electrode between the second electrode and the third electrode.

18. The semiconductor device according to claim 12, wherein the semiconductor device is a Schottky barrier diode,
wherein the second electrode is a cathode electrode,
wherein the third electrode is an anode electrode having a Schottky characteristic with respect to the second semiconductor layer.

19. The semiconductor device according to claim 12, wherein the semiconductor device is a field effect transistor,
wherein the second electrode is a drain electrode,
wherein the third electrode is a source electrode,
wherein the semiconductor device further comprises a gate electrode as a fourth electrode between the second electrode and the third electrode, and wherein the semiconductor device is cascoded with another transistor in which an avalanche breakdown occurs, by the source electrode being short-circuited with a drain electrode of the another transistor.

* * * * *